US006963824B1

(12) United States Patent
Davidson et al.

(10) Patent No.: US 6,963,824 B1
(45) Date of Patent: Nov. 8, 2005

(54) METHOD AND APPARATUS FOR GEOMETRIC VARIATIONS TO INTEGRATE PARAMETRIC COMPUTER AIDED DESIGN WITH TOLERANCE ANALYSES AND OPTIMIZATION

(76) Inventors: Joseph K. Davidson, 704 E. Erie Dr., Tempe, AZ (US) 85282; Jami J. Shah, 7530 E. Ironwood Ct., Scottsdale, AZ (US) 85258; Amir Mujezinović, 18 F Brookedge, Guilderland, NY (US) 12084

( * ) Notice: Subject to any disclaimer, the term of this patent is extended or adjusted under 35 U.S.C. 154(b) by 0 days.

(21) Appl. No.: 09/507,542

(22) Filed: Feb. 18, 2000

Related U.S. Application Data
(60) Provisional application No. 60/120,961, filed on Feb. 19, 1999.

(51) Int. Cl.[7] .............................................. G06F 17/10
(52) U.S. Cl. .............................. 703/2; 703/1; 345/421; 342/442
(58) Field of Search .................... 703/2, 1; 345/420, 345/855; 342/442

(56) References Cited

U.S. PATENT DOCUMENTS

| | | | | |
|---|---|---|---|---|
| 4,649,498 A | * | 3/1987 | Kedem et al. ............... | 345/420 |
| 4,800,652 A | * | 1/1989 | Ballas et al. ................. | 33/552 |
| 5,549,857 A | * | 8/1996 | Kamiguchi et al. ......... | 264/40.1 |
| 5,574,468 A | * | 11/1996 | Rose ........................... | 342/442 |
| 5,586,052 A | * | 12/1996 | Iannuzzi et al. .............. | 703/1 |
| 5,875,264 A | * | 2/1999 | Carlstrom .................... | 382/181 |
| 6,137,492 A | * | 10/2000 | Hoppe ......................... | 345/420 |
| 6,256,039 B1 | * | 7/2001 | Krishnamurthy ............ | 345/420 |

OTHER PUBLICATIONS

New Riders' Reference Guide to AutoCAD 13, by Randall A. Maxey et al., New Riders Publishing, 1995, ISBN 1-56205-237-3, pp. 227-229 (DIM), pp. 277-284 (DVIEW), 674-679 (TOLERANCE and parallelism).*

H.S.M. Coxeter, Introduction to Geometry Second Edition, John Wiley & Sons, Inc., 1989, Second Edition, pp. 216 to 221.*

D.M.Y. Summerville, Analytical Gometry of three Dimensions, Cambridge University Press, 1959, pp. 26-31 and 336-341.*

J. Plucker, On a New Geometry of Spaces, pp. 725-727.*

K.H. Hunt, Kinematic Geometry of Mechanisms, Clarendon Press, Oxford, 1978, pp. 304-307.*

(Continued)

*Primary Examiner*—Kevin J. Teska
*Assistant Examiner*—Ed Garcia-Otero
(74) *Attorney, Agent, or Firm*—Daniel L. Dawes; Myers Dawes Andras & ShermanLLP

(57) ABSTRACT

The objective of the invention is a bi-level method for modeling geometric tolerances compatible with the ANSI/ASME tolerance standard. At the local level, the model represents each tolerance-zone for a plane or an axis (line) as a tolerance map, and it includes the computational techniques that relate interdependencies between these regions and subregions within them. The model includes formulations for variations in size, form, orientation, position, and runout, and combinations of these, because all of these variations can be modeled using points, lines, and planes. Since variations in simple profiles that are formed from lines and circular arcs also can be described by such combinations, they too are includable in the formulation. The primary method is to overlay the geometry of tolerance-zones onto some traditional modes for representing planes, lines, and points. At the global level, the model inter-relates all frames of reference on a part or an assembly.

23 Claims, 19 Drawing Sheets

OTHER PUBLICATIONS

ACIS Geometric Modeler Application Guide, Spatial Technology, Inc., 1996, p. 1-1 to p. 4-10.*

Francesco Chiesi et al., Tolerance Analysis with eM-TolMate, Transactions of the ASME, vol. 3 Mar. 2003, p. 100-105.*

Zengshu Shen, Tolerance Analysis with EDS/VisVSA, Journal of Computing and Information Science in Engineering, Mar. 2003 vol. 3, pp. 95-99.*

The 3D DCM Manual Version 2.6.0, D-Cubed Ltd., Mar. 2002, pp. 1-29.*

T. Kandikhan et al., A mechanism for validating dimensioning and tolerancing schemes in CAD systems, Computer-Aided Design 33 (2001), pp. 721-737.*

Jami J. Shah et al., Representation and mapping of geometric dimensions from design to manufacture, Proceedings of the 1996 ASME Design Engineering Technical Conferences and Computers in Engineering Conference, 1996. 96-DETC-DAC-1481.*

* cited by examiner (a)

(b)

METHOD AND APPARATUS FOR GEOMETRIC VARIATIONS TO INTEGRATE PARAMETRIC COMPUTER AIDED DESIGN WITH TOLERANCE ANALYSES AND OPTIMIZATION

RELATED APPLICATIONS

This application is related to U.S. Provisional application Ser. No. 60/120,961 filed on Feb. 19, 1999, which is incorporated herein by reference.

Financial assistance for this project was provided by the U.S. Government, National Science Foundation, Grant No. DMI-9821008, and the United States Government may own certain rights to this invention.

BACKGROUND OF THE INVENTION

1. Field of the Invention

The invention relates to computer assisted design (CAD) and in particular is a tool for assisting designers in making correct decisions about allocating dimensional and geometric tolerances for proper functioning of precision mechanical parts and assemblies.

2. Description of the Prior Art

Imperfections occur in manufacturing and they must be considered in design so that parts will assemble and function properly. A tolerance specifies the range of imperfections in size and shape that can be permitted for a part to be acceptable when in use. Because tolerances provide the description of all possible outcomes in the manufacture of an object or machine, they do describe all the possibilities for rejecting a part because of shape or size. Conventional tolerances describe only a selection of variations in position for a feature which are permitted by the specified tolerance (s), i.e. those variations that are in the directions of the dimensions. Geometric tolerances describe all the geometric ways that variations in sizes and shapes of features on parts can interact to influence the function of the parts or a machine in which those parts operate. These variations are not now well understood by many engineers in design and manufacturing.

Understanding the causes and effects of dimensional and geometric variations is a major concern in the design and manufacture of mechanical products. However, effective tools for assisting designers in allocating tolerances and identifying trade-offs during the design process do not exist today because of (a) a lack of integration between CAD systems and tolerance analysis software, and (b) the inability of the latter to treat dimensional and geometric tolerances in three dimensions consistently with ASME Y14.5 standard. Today's modern parametric CAD systems are limited to nominal geometry and idealized constraints; tolerances are supported superficially as textual attributes attached to geometric entities. Whereas parametric solid models in CAD are mathematically well grounded, geometric tolerance specifications are based on ad-hoc conventions collected from years of engineering practice. The attempt to retrofit a model to the tolerance standard has not gone far enough. The interface between CAD and tolerance analysis can be described as weak, at best. The scope of tolerance analysis is also not adequate to answer many of the designer's queries. The fundamental requirement for overcoming all of the above problems is a well formulated model, along with complementing computational models, to represent geometric variations of part entities and their inter-dependencies.

Designers are essentially concerned with the following dimension and tolerance (D&T) issues:

1. What mating conditions (clearance and form) are needed to achieve the intended function(s) satisfactorily?
2. Which dimensions and features contribute to variations of each mating condition and in what ways?
3. How to visualize all possible types of geometric variations and all combinations of such types?
4. How to optimally distribute (allocate) the allowable net variation at mating surfaces between all the contributing dimensions and geometric variations?

What is needed is a method and apparatus for providing solutions to the questions 2–4.

Conventional tolerancing (AKA dimensional tolerancing) refers to the older practice of assigning plus and minus deviations to linear or angular dimensions. Geometric tolerancing refers to modern methods prescribed in the ANSI/ASME Y14.5 standard. The ANSI/ASME Y14.5 standard differs from conventional tolerancing in that (i) it uses explicit Datum Reference Frames (datum reference frame), (ii) Datum and Targets (D & T) are directed one way (datum controls target and not vice versa), and (iii) other types of nondimensional variations, such as form, profile, and runout, are also included.

Prior modeling of geometric tolerances and state of the art of commercial tolerance analysis software is described as follows. A variety of models have been proposed in recent years to represent geometric tolerances. They can be divided into five generic approaches: 1) parametric models, 2) offset zone models, 3) variational surface models, 4) kinematic models, and 5) degrees of Freedom (DOF) models.

In parametric CAD, the nominal shape and size is represented by a set of explicit dimensions and constraints from which a set of simultaneous equations are obtained. Solving these equations gives one or more values for the dependent dimensions. Tolerances are incorporated by allowing plus and minus variations in the dimensions. The method has been successful with two dimensional profiles. Application to the general three dimensional problem is limited because of (a) difficulty of solving constraint equations in three dimensional, and (b) the equations are written and solved for vertex positions, limiting application to only polyhedral parts. Form tolerances cannot be included, neither can datum reference frames nor directed datum-target relations. Indirect parameterization methods have also been developed to decouple model construction variables from datum and targets variables. Most current commercial software systems for tolerance analysis rely on this approach, e.g. SDRC/IDEAS, Cognition/Mechanical Advantage).

In offset zone models a tolerance zone is modeled as Boolean subtraction between maximal and minimal object volumes obtained by offsetting the object by amounts equal to the tolerances on either side. The construction of such a composite tolerance zone from boundary surfaces of the part does not allow one to model each type of variation separately, nor to study their interactions. Another problem is that some tolerances in the ASME standard, such as position, apply to axes or mid planes of toleranced features, not the boundary; these cannot be modeled by such offset zones. The effect of datum reference frames precedence is also not accounted for.

In the model using variational surfaces each surface is varied independently by changing the values of model variables from which surface coefficients are calculated; positions of the vertices and edges are computed from the surface variations. Form tolerances can be handled either by using higher degree surfaces than the nominal surface or surface triangulation. This model leads to some topological problems, such as maintenance of tangency and incidence conditions. This model, too, as the previous two described, is incompatible with the ASME tolerance standard Y14.5.

In kinematic models building on prior work to analyze tolerance stack-up in mechanisms using transformation matrices, the art has developed a kinematic model by representing each tolerance class (variation type) by a combination of kinematic joints. These combinations were then used to estimate geometric variations caused by feature tolerances. They have yet to show how this approach can be extended to combine the interaction of geometric variations with size dimensions. Also, Rule #1 of Y14.5 standard cannot be enforced. The ASME Standard, Y14.5 has been incorporated into BYU software which is in use at several companies, e.g. Texas Instrument, and Sandia.

In degree of freedom models it appears that during the time period 1988–1993, several groups and ASME were independently working on some form of spatial degree of freedom model to represent datum and targets. One prior art effort defined a general purpose symbolic system for reasoning about assemblies based on constraints and relative degrees of freedom. The determination of degrees of freedom of parts in an assembly, assembly feasibility based on nominal dimensions, and inference of component relative positions from joint conditions by symbolic reasoning have been demonstrated.

Another prior art effort developed an elaborate mathematical foundation for datum and targets as follows. Displacements and rotations that leave seven elementary surfaces (planes, cylinders, spheres, etc.) unchanged were determined. For each pair of the seven technologically and topologically related surfaces (TTRS) they elaborated the 28 different geometric relationships possible and the consequent remaining degrees of freedom for each combination. A displacement torsor was defined as a six dimensional vector, containing three rotation values and three translation values. For each tolerance related to a TTRS, the tolerance zone was represented as a torsor containing the non-invariant rotations and translations. They also demonstrated the minimum datum reference system needed for each tolerance type. However, this representation is unable to distinguish between variation resulting from size, form, and location. Also, datum precedence was not considered. Still another prior art effort used the more traditional geometric transformation matrices with homogeneous coordinates rather than torsors.

The ASME Y14.5.1 report also discusses the degrees of freedom idea in the context of reference frames needed. Displacement invariance of three basic elements were studied (points, lines, planes). All combinations of these three elements were enumerated; the reference system could be any one, two, or three of these basic elements. The part is assumed fixed, while the reference element(s) can move. The report concluded that there were only six possible dawn reference systems from the point of view of the type of geometric controls placed on the part. The report lists reference frames meaningful to some of the tolerance classes.

Five types of analyses are commonly commercially available: sensitivity, % contribution, worst case statistical, and Monte Carlo simulation. In all cases the objective is to look at the effect of geometric variations on a particular dimension or clearance of interest, which must then be expressed as a function of all contributing geometric variations. The function is linearized and partial derivatives calculated for each contributor; the derivatives give the local slope or sensitivity for each contributor. From the sensitivities worst case and variance can be determined. One error built into these systems is that all contributors are considered independent of each other. Systems also differ in what contributors are taken into account: plus and minus dimensions only, orientation, or form.

Two basic approaches are used for generating the function for the dimension of interest: procedural and variational. The procedural approach allows one to build models with unidirectional constraints that can be solved one at a time, while variational allows declarative modeling where constraints are highly coupled and solved simultaneously. Both approaches are based on parametric models, and thus have the limitations given before. The variational approach can only be used for solving equations in two dimensional, while the procedural approach cannot handle coupled constraints, in general because a step by step construction procedure must be specified to relate the dimension to be analyzed and the contributors.

Tolerance software is available both within CAD systems and from third parties. To the casual observer the capabilities of these systems may be misleading. Just because a system allows one to create ANSI/ASME symbolic tolerance frames and attach them to features on a drawing or solid model does not mean that those tolerances are used in stack up analysis. In many systems, the information from the tolerance frames is used only for making superficial checks on syntax, the number of datum entities, etc. In other cases, only the plus and minus dimensional tolerances are used in analyses, while geometric tolerances are ignored. At best, tolerance analysis is based on the same parameters and parametric equations as those used in geometry construction.

Commercial systems have many limitations, particularly the lack of full conformance to the Y14.5 standard. Form tolerances and datum precedence cannot be modeled. Rule #1 is not enforced. They interpret a parallelism tolerance as a single parameter instead of coupled location and orientation. These problems result from a lack of a fundamental model for geometric variations of imperfect parts.

BRIEF SUMMARY OF THE INVENTION

The invention is a bi-level math model, namely local and global model, which will not only make it easy to investigate which dimensions and features contribute and how to optimally distribute (allocate) the allowable net variation, but also to provide a mechanism for visualizing all types of geometric variations and their combinations. It will also be shown that the method of the invention is compatible with the ANSI/ASME tolerance standard.

The objective of the invention is a bi-level method for modeling geometric tolerances. At the local level, the model represents each tolerance-zone for a plane or an axis (line) as a multidimensional region, or map, and it includes the computational techniques that relate interdependencies between these regions and subregions within them. The model includes formulations for variations in size, form, orientation, position, and runout, and combinations of these, because all of these variations can be modeled using points, lines, and planes. Since variations in simple profiles that are formed from lines and circular arcs also can be described by such combinations, they too are included in the formulation. The primary method is to overlay the geometry of tolerance-zones onto some powerful traditional mathematics for representing planes, lines, and points. Because the model is based on traditional geometry, there is a rich supply of alternatives for representing it.

At the global level, the model inter-relates all frames of reference on a part or an assembly. While the local model is the core of the invention, the global model is addressed to the structure needed for software implementation.

There are several unique features to the model. First, the method for representing tolerances in the local model is new.

Second, the bi-level model treats dimensional and geometric tolerances in three dimensions in a manner consistent with the ASME Y14.5 (1994) standard on tolerances. Third, the local model has both a geometric form for visualization and an algebraic form for statistical analysis. Fourth, because any two outcomes for a geometric feature are separated only slightly in a tolerance-zone, the resolution between adjacent planes (or points or lines) in the zone is the same everywhere. This consistent resolution is included in the new bi-level model and it has the potential to make more readily apparent the manufacturing and cost consequences of different choices in tolerance allocation.

The invention is a tool for assisting designers in making correct decisions about allocating geometric tolerances. It also would permit designers to identify trade-offs and to optimize the allocation of tolerances. It also allows designers to visualize all possible geometric variations and combinations thereof to get a sense of the trade-offs involved. The impact should be in the form of shorter design time, fewer iterations in the prototype phase of design, and hence lower cost.

In particular, the invention is a method of evaluating tolerances of computer assisted designs for the manufacture of objects. The method comprises the steps of representing each tolerance zone for each geometric feature of the object by a tolerance map stored in a computer. The tolerance map is a convex volume whose shape depends on the tolerance type and whose size depends on the tolerance values. It is a means to visualize the extent of variations allowed. Interdependencies between the stored maps and interdependencies between submaps of the stored maps are computed to determine how different tolerance zones for the geometric feature affect each other and to determine how different tolerance zones for different geometric features of the object affect each other. Tolerance conditions for the object are selected to optimize allocation of tolerances to each of the geometric features of the object.

The step of representing each tolerance zone for each geometric feature of the object comprises a tolerance map representing the variations that are permitted for a plane, axis or edge, cylindrical surface, position, or that are permitted by a composite of tolerances.

The step of representing each tolerance zone for each geometric feature of the object comprises creating a tolerance map in a space of points, each of which is associated with one variational possibility in the tolerance zone.

The step of computing in the computer interdependencies between the stored maps and interdependencies between submaps of the stored maps comprises superimposing on a tolerance zone of the geometric feature a tolerance zone specifying parallelism of variations of the geometric feature, or flatness of the geometric feature. The function needed is a Minkowski sum of the individual tolerance maps.

The step of computing in the computer interdependencies between the stored maps and interdependencies between submaps of the stored maps comprises generating a tolerance zone of an assembled geometric feature for a assembly of at least two objects. Each of which objects has a corresponding tolerance zone for corresponding geometric features which are being assembled to comprise the assembled geometric feature.

In the case of a plane, representing each tolerance zone for each geometric feature of the object comprises creating a tolerance map in a space of points of the object expressed in Barycentric (areal) coordinates.

In the case of a cylindrical surface, representing each tolerance zone for each geometric feature of the object comprises a tolerance map in a space of points, each of which corresponds to one variational outcome for the surface, expressed in screw coordinates. Both size and position of the axis are included in the tolerance map.

In the case of an edge or axis, representing each tolerance zone for each geometric feature of the object comprises a tolerance map in a space of points, each of which corresponds to one variational outcome for the edge or axis, expressed in Pluecker coordinates. The results is a line-solid.

The method further comprises the step of establishing a global model to relate all local models on a part or assembly by mapping surfaces used as datum or targets in a dimensioning scheme to equivalent control frames in which datum reference frames are rigid sets and validated using degree of freedom algebraic operations, and by representing dimensions and tolerances by the union of corresponding control frames involving the datum and target rigid sets and corresponding tolerance classes. The step of mapping surfaces used as datum or targets in a dimensioning scheme to equivalent control frames comprises forming datum reference frames as rigid sets for target features and feature patterns, such as a circular pattern of bolt holes.

The method further comprises the step of identifying redundant or conflicting restraints by using a degree of freedom algebra on control frames by determining whether the corresponding datum reference frame is a rigid set and the maximum degrees of freedom which the datum reference frame controls.

The invention is also defined as an apparatus for geometric variations to integrate parametric CAD with tolerance analysis and optimization of a manufactured object. The apparatus comprises a global model module of the manufactured object stored in a computer, which global model module is implemented as a mixed attributed graph structure having nodes, arcs, attributes, and superimposed subgroups. The nodes are datum or target entities either boundaries (real) or resolved feature entities (virtual). The arcs are geometric constraints R. The attributes are dimension and tolerance values and precedence relations. The superimposed subgroups on the graph represent control frames. In the preferred embodiment seven software modules are used, namely a geometry definition system (M1), a dimensioning module (M2), a global model visualization module (M3), a tolerancing module (M4), a D&T schema advisor (M5), and two local model modules, a tolerance allocation module (M6), and a local model visualization (M7) of the manufactured object are stored in the computer. The implementation also requires the use of three types of conventional software libraries: a geometric engine (E1), a constraint solver (E2) and a statistical tolerance analysis package (E3).

The invention now having been briefly summarized, turn to the following drawings where in like elements are referenced by like numerals.

BRIEF DESCRIPTION OF THE DRAWINGS

FIG. 5a shows possible locations for the bounding planes on form. FIGS. 5b and 5c show equal areas which represent planes not devoted to form.

FIG. 12a is a three dimensional representation, and FIG. 12b is a half cross section about the axis of symmetry of FIG. 12a.

Figure 1:
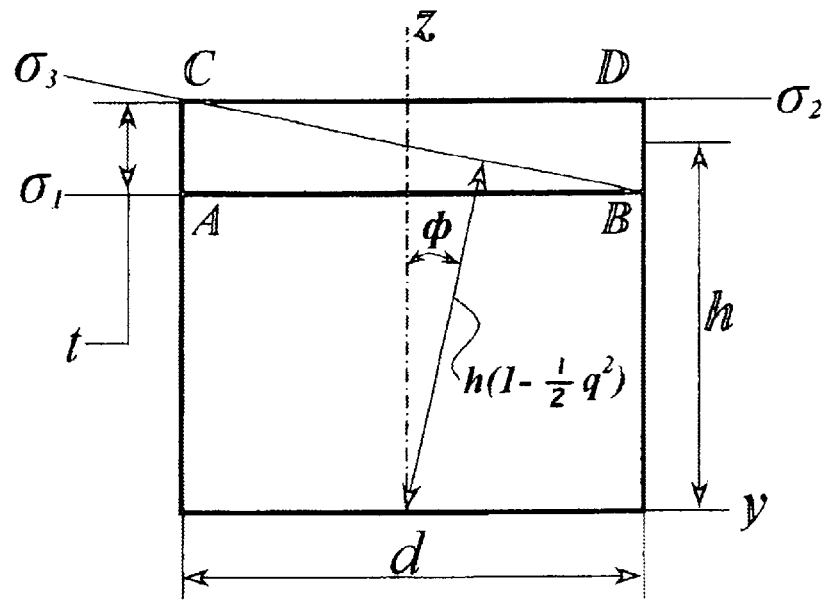
FIG. 1 is a schematic diagram which depicts the length dimension for a round bar and its tolerance.

The invention and its various embodiments may now be understood by turning to the following detailed description of the preferred embodiments.

DETAILED DESCRIPTION OF THE PREFERRED EMBODIMENTS

The invention is a method processing geometric variations which method is rich enough to model all classes of dimensions and tolerances (except free form profile) consistent with tolerance standards and compatible with parametric solid models. A bi-level model is described: one level is for modeling local variations to consider the interaction of all geometric controls (size, form, orientation, position) applied to a feature of interest. The second level is for a global model that inter-relates all control frames on a part or assembly and is needed for software implementation.

To satisfy conformance to the Y14.5 standard, the model must meet the following criteria:

each tolerance class is represented by regions (zones) whose shape depends on the tolerance type and feature being toleranced and the size depends on the tolerance value, material condition, and Rule # 1;

Rule #1 requires perfect form at maximum material condition (MMC), i.e. form and orientation tolerance zones must shrink to zero as the feature approaches maximum material condition;

certain tolerance zones float within other zones: the form tolerance zone has floating position and orientation within the size zone, while the orientation zone floats only in position within the size zone;

composite zones are not acceptable, variations must be resolved into component zones;

tolerances are applied to both resolved entities (axes, mid-planes), and to boundary elements (faces, edges);

the convention of "bonus tolerances" provides a means for trading position variation for size variation;

all datum and targets relations (except size) are one-directional, i.e. datum-to-target;

datum precedence order determines the coordinate directions of control.

These last two points, which have been ignored by commercial and prototype analysis systems of today, arise from the fact that real parts have imperfect form; inspection fixtures or gauge blocks "simulate" perfect planes when setup in a certain order, which determines the measurement direction. Also we do not know of any system or model that takes into account Rule #1, floating zones, and bonus tolerances. The local variation model proposed here will establish a finite set of multivariate regional models that we call "tolerance maps" to model each type of geometric variation and also combination of maps to represent the interaction between all tolerances applied to a given feature. Tolerance maps can represent floating zones within size zones. Also, we will show below that Rule #1 is embedded in this representation. Local models for axes, planes, and cylindrical surfaces are proposed. The tolerance map for a plane has a profile modeled in Barycentric coordinates. The sweep of this profile gives a region (geometric map) whose overlapping subdivisions represent all possible variations of the feature in all sections in three dimensions. The tolerance map for an axis is represented as a line-solid with overlapping subdivisions. Each line is represented with the six Pluecker coordinates. The tolerance map for a cylindrical surface is a swept solid of screws in higher dimension; each element of the solid is represented with a line and associated pitch.

A global variation model is needed for three reasons: (1) to inter-relate control frames for dimensioning scheme validation and providing the data needed to generate local models; (2) to integrate the tolerance model with parametric CAD; and (3) to interface the tolerance model with statistical tolerance analysis packages.

At the core of parametric CAD there are three graphs: a topological graph (represented hierarchically), a constraint graph (represented as bi-partite), and a construction history tree. In order to capture the dimension control scheme, a separate datum and targets graph will be created which will not be dependent on the parameterization and construction order of the geometric model. In order to maintain consistency between the parametric CAD models and datum and targets model, a progressive (control frame at a time) mapping procedure is proposed.

We do not plan on duplicating or replacing the tolerance analysis capabilities of commercial systems. However, we do need to replace the design function used in these packages for sensitivity and stack-up calculations.

The local model often leads to two tolerance maps that must be fitted together. For example in a stackup, one map describes the limited variability that functionality permits between two entities at the ends of the assembly. The size and shape of the second map is controlled by the geometric tolerances chosen for each feature along the stackup. Acceptable combinations of tolerances are those that fit the second map entirely within the first.

The implementation of the invention will require the use of three types of external or conventional commercial software: a geometry engine (ACIS, e.g. parasolid or DesignBase), a constraint solver (e.g. D-Cubed DCM, 2D/3D, design sheet or MAPLE), and a tolerance analysis packages (e.g. Mech. Advantage, VSA-3D).

Consider first the formulation of the a local model which formulates the tolerance map for planes, lines, and cylindrical surfaces as feature entities. The tolerance maps can be used (i) to represent geometric tolerances for planes with as much ease as it represents conventional tolerances and (ii) to properly accumulate geometric tolerances in a stackup.

Two concepts from traditional geometry are needed to formulate the tolerance map for planes. First, the entire space of points is interchangeable with (dual to) the entire space of planes; this is evident from the symmetry in the equation tx+uy+vz+sw=0. When t, u, v, and s are given, the equation gives the coordinates of all the points that lie on the plane defined by (t, u, v, s); when x, y, z, and w are given, the equation gives the coordinates of all the planes passing through the point (x, y, z, w). The second concept is that of Barycentric coordinates or areal coordinates, a scheme whereby any one point (x, y, w) in a two dimensional region of points is represented with varying proportions of the three homogeneous coordinates used to describe it (see e.g. Coxeter, H. S. M. (1969). Introduction to Geometry, 2nd ed. Wiley which is incorporated herein by reference).

Figure 2:
FIG. 2 is a schematic diagram which depicts a triangular array of points that correspond to the two dimensional array of planes shown in FIG. 1.

A round bar of diameter d and with a tolerance t on the length dimension h is shown in FIG. 1. Two bounds to the tolerance-zone are shown as the planes $\sigma_1$ and $\sigma_2$. According to the 1994 standard, ASME, 1994, Dimensioning and tolerancing, ASME Y14.5M-1994, American Society of Mech. Engineers, the tolerance-zone is defined as a three-dimensional set of planes, each representing a possible location for the end plane of the bar. Every one of these planes could be assumed by an infinitesimally thin disc of diameter d. Then the tolerance-zone could be regarded as every position that the disc could occupy as it wobbled freely in the confined region between $\sigma_1$, and $\sigma_2$. First, consider only a two-dimensional set of planes in FIG. 1, i.e. those that are parallel to the x-axis (appear as lines) and are either perpendicular to z or tilted clockwise. Of these $\sigma_3$ plane has the greatest clockwise tilt for the end of the bar. Now, to apply the concept of Barycentric (areal) coordinates above, consider that $\sigma_1\sigma_2$ and $\sigma_3$ are three basis planes that define the space of our two-dimensional set of planes in FIG. 1. Using duality, arrange three corresponding basis-points as vertices of a triangle in FIG. 2 and assign one of the basis-planes to each. Then the points on the line-segment $\sigma_1\sigma_2$ in FIG. 2 represent the parallel planes that are perpendicular to the z-axis in FIG. 1 and lie between $\sigma_1$ and $\sigma_2$. The points on the line-segment $\sigma_1\sigma_3$ in FIG. 2 correspond to those planes in FIG. 1 that are parallel to the x axis and pass through point B between $\sigma_1$ and $\sigma_3$. Similarly, line-segment $\sigma_2\sigma_3$ corresponds to those planes in the tolerance-zone of FIG. 1 which are parallel to the x-axis and pass through point C.

Any point $\sigma$ in FIG. 2 can be represented as a weighted linear sum of the basis points, i.e.

$$\sigma = c_1\sigma_1 + c_2\sigma_2 + c_3\sigma_3;$$

for $c_1$, $c_2$, and $C_3$ all positive, $\sigma$ corresponds to any point inside $\Delta\sigma_1\ \sigma_2\ \sigma_3$. Further, so long as the triangle is made equilateral, as in FIG. 2, equation (1) provides that the sum of the perpendiculars drawn to the three sides from $\sigma$ is equal to the height of the triangle. Consequently, when the height is 1 unit, $c_1+c_2+c_3=1$. This diagram is commonly used as a composition chart for the alloys obtainable from three metals.

Consider again the two dimensional set of planes in FIG. 1 that are parallel to x and also are either perpendicular to z or tilted counterclockwise. A similar two dimensional set occurs in any diametrical section through the tolerance-zone. In fact, every plane in the tolerance-zone of FIG. 1 is encountered by sweeping the two dimensional set (basis $\sigma_1$, $\sigma_2$, $\sigma_3$) in FIG. 1 by a full turn about z. Therefore, the three dimensional point-map that maps to the entire tolerance-zone in FIG. 1 is the solid of revolution in FIG. 3 that is obtained by revolving the triangle in FIG. 2 a full turn about the line $\sigma_1\sigma_2$. This solid has the form of two right-circular cones set base-to-base. The triangle of FIG. 2 is labeled in FIG. 3. Also labeled in FIG. 3 is plane $\sigma_4$, the point that corresponds to the plane in FIG. 1 that is parallel to the x-axis and has the maximum counterclockwise tilt (goes through points A and D).

Figure 3:
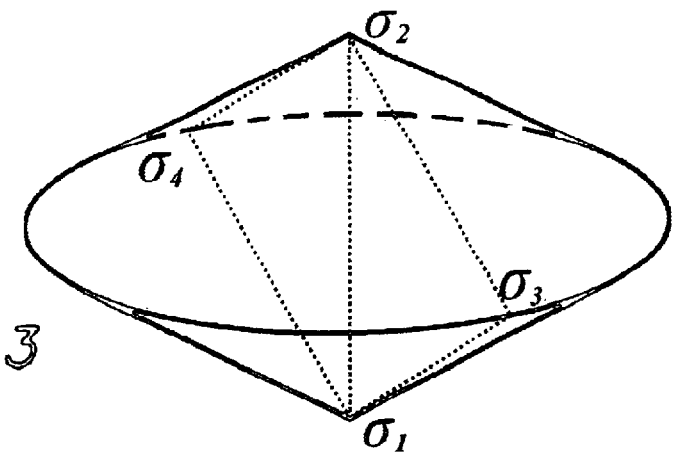
FIG. 3 is a schematic diagram which is a three-dimensional point map that is dual to the entire tolerance zone shown in FIG. 1.

It is useful to note that every plane represented in FIGS. 2 and 3 is perfectly flat, i.e. of perfect form. However, the other extreme is possible too, i.e. the end-plane is perfectly oriented but its variation in form occupies the entire region between $\sigma_1$, and $\sigma_2$. Then, every plane represented by FIG. 3 is devoted to form.

The ASME standard specifies a tolerance on parallelism as a zone defined by two parallel planes that are parallel to a datum plane or axis and within which the surface must lie. For the bar in FIG. 1, take the datum to be the lower end of the bar (marked A in FIG. 4(a)). Then, if the tolerance on parallelism is t' (t'<t), the effect in FIG. 1 is to limit the variation on orientation (e.g. plane a' in FIG. 4(a)) but not to further limit variation on location; the limiting planes for parallelism that are separated by t' can shift up or down anywhere in the tolerance zone t. The point-map for a diametrical section becomes a trapezoid (FIG. 4(b)), i.e. the point-map of FIG. 2 with the dotted triangle removed. The increment in cost for manufacturing the bar must be related to the planes that can no longer be occupied by the end, i.e. the volume of revolution formed by revolving the dotted triangle in FIG. 4(b) about the line $\sigma_1\sigma_2$.

Figure 5A:
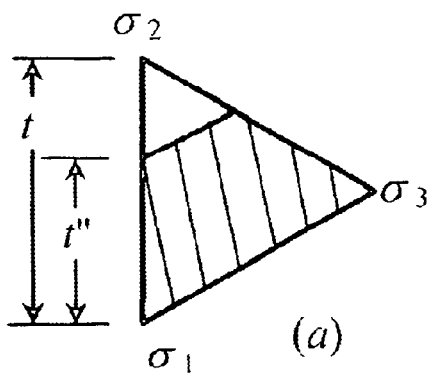
FIGS. 5a–5c are schematic diagrams which are a modification of FIG. 2 when there is an added tolerance on flatness.
Figure 5B:
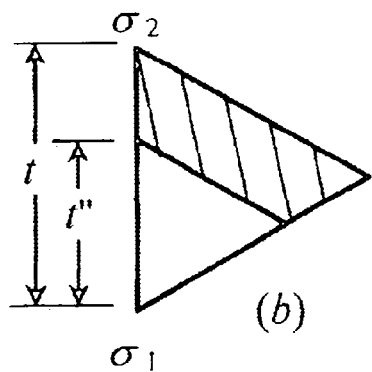

The 1994 standard specifies a flatness tolerance t" as a zone defined by two parallel planes t" apart within which the surface must lie, and these limiting planes can change in both position and orientation within the tolerance-zone t, somewhat like a coin wobbling in a short tin can of height t and the same diameter. The point-map for the section of FIG. 2 then becomes the one in FIG. 5(a) in which points in the unshaded triangle represent (as a section of the volume) the locations that the coin can occupy within the tolerance-zone t. Of course, the tolerances for flatness and location can be coupled. For example, if the surface at the top end of the bar (FIG. 1) were of higher quality than the limits specified by t", the boundary between the hatched and unhatched regions in FIG. 5(a) would be lower, thereby leaving greater latitude for location of a thinner coin. Flatness tolerance t" requires that the maximum region of planes that can be devoted to form be represented (in section) by the triangle of side t" in FIG. 5(b). Then the additional cost must be related to the planes that can no longer be devoted to form, i.e. a volume of revolution formed by revolving the hatched trapezoid in FIG. 5(b) about the line $\sigma_1\sigma_2$. However, as the coin changes location in the tolerance-zone t, the triangle of side t" in FIG. 5(b) translates within the triangle of side t, thereby changing the shape of the hatched region and also the radius to its centroid. A reasonable choice for measuring added cost would be with the intermediate volume of revolution swept by the hatched area in FIG. 5(c).

Figure 6A:
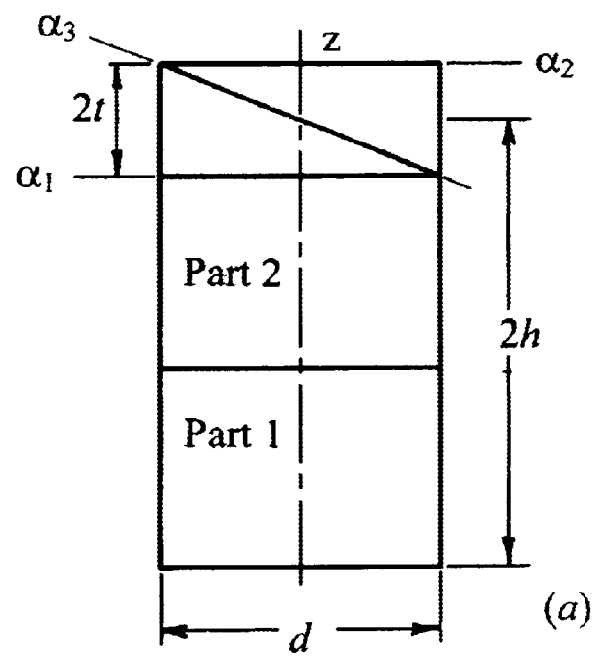
FIG. 6a is a schematic diagram which shows the cumulative tolerance zone for two of the parts in FIG. 1 assembled.
Figure 6B:
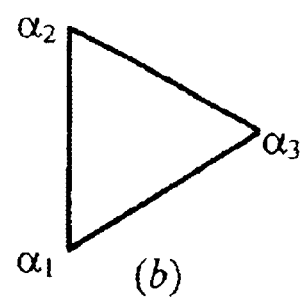
FIG. 6b is a schematic diagram which shows the point map for two of the parts in FIG. 1 assembled.

In FIG. 6(a) is an assembly of two parts, each with the dimensions and tolerance on h shown in FIG. 1. The tolerance-zone for the assembly is shown bounded by the parallel planes $\alpha_1$ and $\alpha_2$ that are separated by the amount 2t. The point-map for the two dimensional set of counter-clockwise planes in this tolerance-zone is developed just as the map in FIG. 2 is obtained from the tolerance-zone in FIG. 1: namely, it is the equilateral triangle in FIG. 6(b) that has side-length twice that of the triangle in FIG. 2. And, when the triangle in FIG. 6(b) is revolved about the line $\sigma_1\sigma_2$, the resulting solid of revolution has eight times the volume as the solid in FIG. 3. The tolerance map-model of the invention, then suggests that the number of planes for the upper surface of the assembly is eight times the number for one of the parts. This assertion presumes, of course, that the resolution for distinguishing between adjacent planes in the tolerance-zone of dimension 2t in FIG. 6 is the same as in the tolerance-zone for a single part (FIG. 1).

Figure 7:
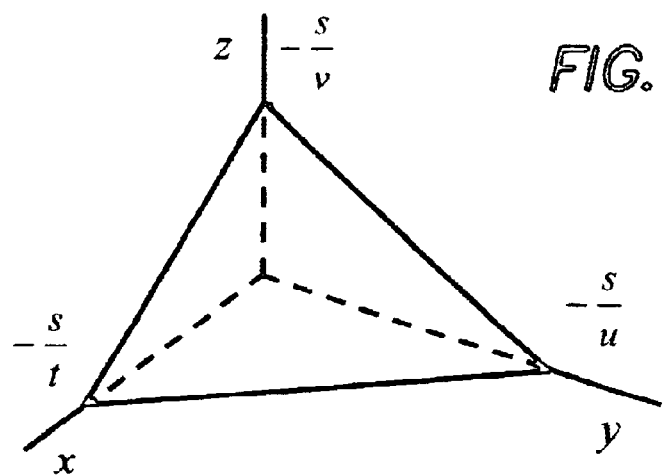
FIG. 7 is a schematic diagram which shows a plane in a Cartesian reference frame.

Thus far we have considered a geometric model for planes. But there is a computational form of the model too that is obtained by simply establishing coordinates for each of the planes in the tolerance-zone. The coordinates (t, u, v, s) for a plane can be obtained from FIG. 7, in which the three coordinate axes are shown piercing the plane. By setting, say, y and z to zero in tx+uy+vz+sw=0, the pierce-point for the z-axis is s/t (w is set to 1 so length measurements are metric).

Now consider again the dimension h and its tolerance t in FIG. 1. Let the ratio t/d=q be a measure for the maximum tilt that is permitted in the tolerance-zone. Angle $\phi$ is $\phi(p=arctan(t/d)=arcsin(t/d)=t/d$, and $\cos \phi=(1-q^2/2)$            (2)

for small angles $\phi$(i.e. t<<d). A zero for any of the homogeneous coordinates t, u, or v signifies that a plane is parallel to the corresponding coordinate axis. Therefore, of the planes in the zone that are parallel to the Cartesian xy-plane (see FIG. 1), the lowest and the highest have the coordinates $\sigma_1=\{0,0,1, -(h-t/2)\}$ and $\sigma_2=\{0,0,1, -(h+t/2)\}$ respectively. And the coordinates (t, u, v, s) for any plane at the maximum tilt permitted by the tolerance band in FIG. 1 are $\sigma=\{q \cos \theta, q \sin \theta, 1-q^2/2, -h(1-q^2/2)\}$      (4)

where the angle $\theta$ is measured from the xz plane about the z-axis to another plane that is perpendicular to a and contains the z axis. The plane $\sigma_3$ in FIG. 1, then, is identified with $\theta=\pi/2$.

Figure 4A:
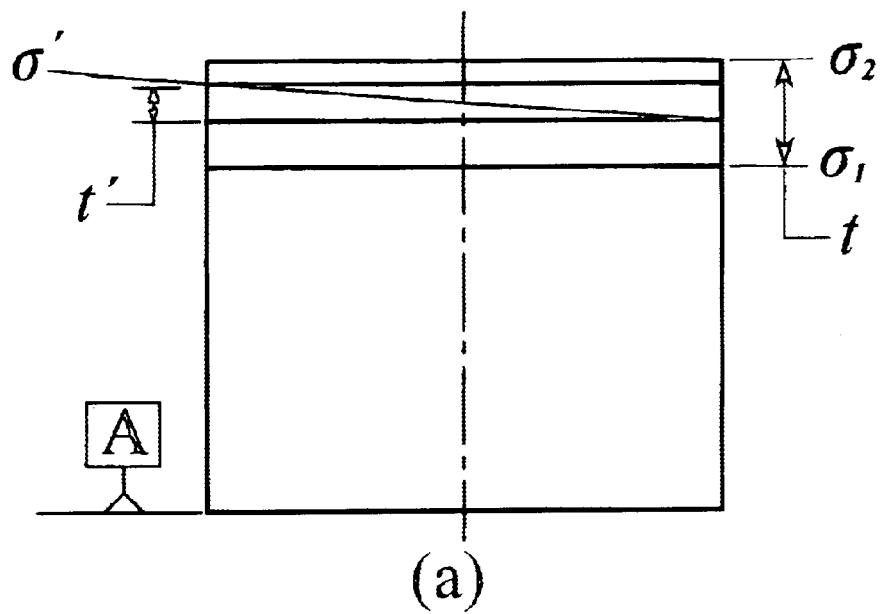
FIG. 4a is a schematic diagram which is a modification of FIG. 1 when there is an added tolerance t' relating to parallelism.
Figure 4B:
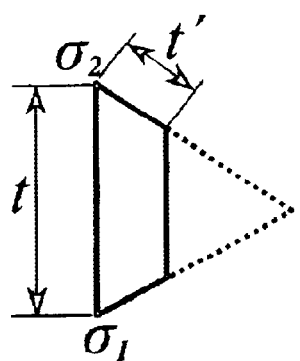
FIG. 4b is a schematic diagram which is a modification of FIG. 2 when there is an added tolerance t' relating to parallelism.

By using similar methods, the coordinates for all the planes in the tolerance-zones of FIGS. 1, 4(a), and 6(a) also can be obtained.

Consider now the method of the invention for the tolerance map for lines in one tolerance-zone. The geometric form of the tolerance map can be used (i) to represent geometric tolerances for lines with as much ease as it represents conventional tolerances and (ii) be decomposed into regions that are allocated to different geometric tolerances.

Figure 8:
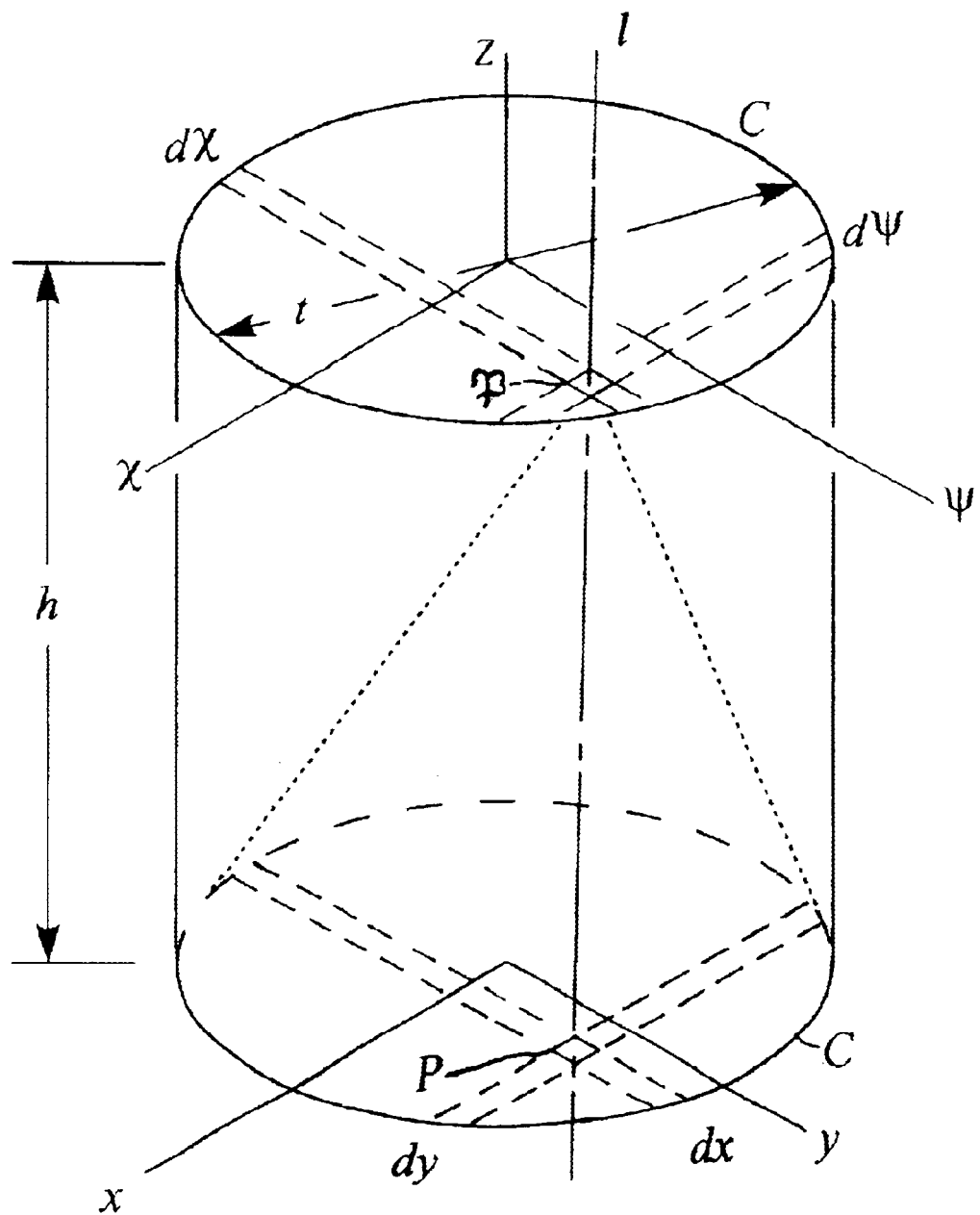
FIG. 8 is a schematic diagram which shows the cylindrical tolerance zone for the axis of a hole determined by circles C and ç. One line, I, in the tolerance zone is defined by the coordinates of the two points (X, ψ) within ç and (x, y) within C.

In ASME Y14.5M the range of locations for an axis is often represented as in FIG. 8, i.e. all acceptable locations of the axis are identified by the line-segments of length h that can be placed in the long thin right-circular cylinder defined by circles (ç and C).

One can visualize the possibilities to be the same as those for locating a soda straw of length h and infinitesimal diameter in a cylindrical can, also of length h, which is bounded at its top and bottom by the circles ç and C, respectively.

It is well known that it takes four independent scalar parameters to define a line (see e.g. Sommerville, D. M. Y. (1959). Analytic Geometry of Three Dimensions. Cambridge U. Press, which is incorporated herein by reference). In the setting of tolerances, the line I in FIG. 8 is located with the four coordinates x, y, $\chi$, and $\psi$. We can then geometrically construct the four-parameter set of lines in the tolerance-zone by letting each of these variables, one after the other, assume all values over their ranges. For example, we first could hold y, $\chi$ and $\psi$ fixed and let only x range interior of the limits determined by circle C; the result would be a partial pencil of lines in a plane parallel to the x-axis and with center at the point ($\chi$, $\psi$). Then when y would also be permitted to assume all values over its range, the combined result would be the partial bundle of lines which is bounded by a cone (shown dotted in FIG. 8) that has its apex at the upper point P and that intersects the xy-plane in circle C. When, additionally, coordinate $\chi$ is permitted to vary, the result is a family of partial bundles, each bounded by a cone that intersects the xy-plane in circle C and that has its apex on the line-segment in circle ç at a distance $\psi$ from the xz-plane. In the traditional literature, such a three-parameter family of lines is called a complex. Then, finally, when coordinate $\psi$ is free, the apexes of the bounding cones occupy all the points within the circle ç, and the construction of the line-solid that forms the tolerance-zone is complete. Of course, a similar construction (that leads to the same result) can be produced by using polar coordinates r, θ, ρ, φ to position points P and P. Mathematically, the line-solid S is obtained with the quadruple integral $$S = \int\int\int\int dx\, dy\, d\chi\, d\psi \text{ or}$$

$$s = \int_0^{t/2} \int_0^{2\pi} \int_0^{t/2} \int_0^{2\pi} dr\, d\theta\, d\rho\, d\varphi \tag{5}$$

Therefore, for the tolerance-zone shown in FIG. 8, the line-solid S is the product of the areas of the two circles ç and C.

According to the Y14.5M standard, when holes are located using bidirectional positional tolerencing, the tolerance-zone for the axis is a rectangular parallelepiped obtained by replacing circles ç and C in FIG. 8 with rectangles R and R. Suppose, for instance, that the same tolerance t is used to locate a hole from two perpendicular sides of a flat plate; then R and R become squares and the tolerance-zone for location is that shown in FIG. 9. The corresponding line-solid is the product of the areas of the two squares, i.e. $S = t^4$.

The Y14.5M standard specifies a tolerance on parallelism for an axis as a zone defined by two parallel planes that are parallel to a datum plane or axis and within which the axis (line) must lie. For instance, the tolerance t' on parallelism (t'<t) is added to FIG. 9 relative to a datum that is also used to locate the hole. When t'=t/2, then the line-solid becomes $$S = t(t/2)t(t/2) = t^4/4 \tag{6}$$

a value ¼ that when no form tolerance is specified.

Just as for planes, there is a computational model for lines in which we use the Pluecker coordinates (See Pluecker, J. (1865). On a new geometry of space. Phil. Trans. 155, 725–791, which is incorporated herein by reference). It is convenient to formulate the Pluecker coordinates of a line from two distinct points $(x_1, y_1, z_1)$ and $(x_2, y_2, z_2)$ through which it passes; the coordinates are (see, e.g. Hunt, K. H. (1990). Kinematic geometry of mechanisms. Clarendon Press, Oxford. [Originally published 1978; now reprinted with corrections, which is incorporated herein by reference.]) the six 2×2 determinants from the array $$\begin{vmatrix} 1 & x_1 & y_1 & z_1 \end{vmatrix}$$
$$\begin{vmatrix} 1 & x_2 & y_2 & z_2 \end{vmatrix} \tag{7}$$

So, for the geometry in FIG. 8, the Pluecker coordinates of a line in the tolerance-zone can be obtained from the two points P and P to give the array $$\begin{vmatrix} 1 & x & y & 0 \\ 1 & \chi & \psi & h \end{vmatrix} \tag{8}$$

in which the values for x, y, χ and ψ are at least two orders of magnitude smaller than h and 1. The six Pluecker coordinates are typically arranged as two concatenated vectors, i.e. l=(L, M, N; P, Q, R)=(Λ, Π) in which the components are L=χ−x  M=ψ−y  N=h
P=hy  Q=−hx  R=xψ−yx The vector Λ=(L, M, N) represents the direction ratios of the line corresponding to the x-, y-, and z-axes, respectively, and, when (L, M, N) is regarded as a force acting along the line, the vector Π=(P, Q, R) represents the x-, y-, and z-components of its moment about the origin. A compatibility condition is inherent in the six determinants from array (8), and therefore also in the Pluecker coordinates in equations (9); it is Λ·Π=0. Further, vector Λ can be regarded as a line-segment on the (infinite) line represented by coordinates (9). Since a segment of any length is sufficient to define the line on which it lies, the coordinates in (9) are homogeneous, i.e. they represent the same line when they are scaled up or down by the same factor. Hence, the six Pluecker coordinates in equations (9) contain just four independent scalar parameters for each line they represent.

Figure 10:
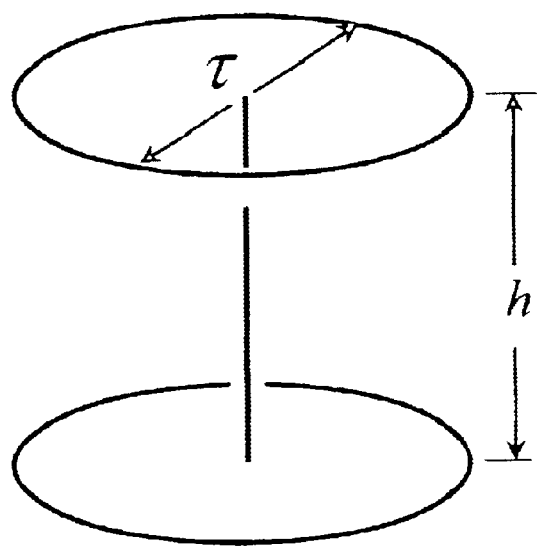
FIG. 10 is a schematic diagram which shows a geometric map of cylindrical surfaces about an axis at true location. The sizes range over the tolerance, t.

Consider now how the method of the invention treats the tolerance map for cylindrical surfaces. The geometrical character of a cylindrical surface can be represented with a line (axis) and a diameter or radius to specify size. The screw is a mathematical entity perfectly suited to specifying a cylinder. Five independent parameters identify a screw, and every screw lies on a line. One can regard the entire space of screws as all the lines in space for each of which a fifth parameter ranges over the real numbers. In the traditional uses for screws, e.g. in expressing an system of forces as a wrench (a coaxial couple vector and force vector on the line), the fifth parameter is the pitch (p), i.e. the ratio of coaxial couple to force. For our purpose we will use the fifth parameter to express values that range over the tolerance on the size of a cylindrical surface that is centered on a line. We represent the tolerance T on size of a cylindrical surface of length h as a line of length h, which is the axis of the hole (or boss) at true position, together with a circle of diameter T at each end (FIG. 10). The circles define an annular region around the axis that is empty of lines but which represents the tolerance on size.

Figure 11:
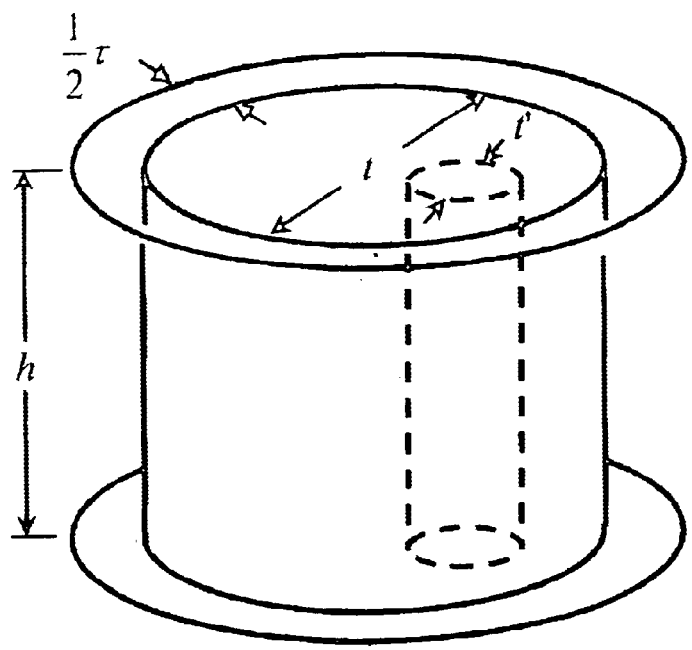
FIG. 11 is a schematic diagram which shows a geometric map of tolerance-screws that represent the possibilities for size (tolerance, t), location of axis (tolerance, t), and orientation (tolerance, t') for a cylindrical hole.

In FIG. 11 is the geometric map for a round hole in a thick plate. It has a tolerance on size of T and its axis is located with two dimensions having the tolerance t. This map is obtained by sweeping the axis and empty annulus in FIG. 10 over every line in the tolerance-zone t (the line-solid defined by the two circles of diameter t and separated by length h). When, in addition, a perpendicularity tolerance t' is specified (3rd datum), the axis cannot tilt more than the angle (t'/h). Then the tolerance-zone t is not filled with lines; instead it contains only lines produced by sweeping the line-solid of diameter t' (shown dashed in FIG. 11) over the cylinder of size t.

The coordinates of a screw look just like the coordinates of a line, i.e. they comprise a concatenated pair of two vectors. The difference is that the quadratic identity Λ·Π=0 now does not hold as it did for lines. Instead, a vector p Λ is added to Π. When they are not normalized, the pitch is $$p = \frac{(LP + MQ + NR)}{(L + M + N)^2} \tag{10}$$

Therefore, every outcome for the cylindrical surface in FIG. 11 can be specified uniquely by adding the 5th parameter (pitch) to the coordinates of every line in the tolerance-zone of diameter t and letting this pitch have a range that equals the tolerance T on size.

Figure 5C:
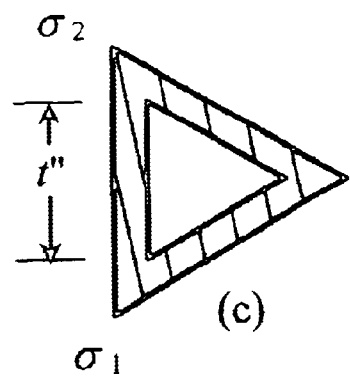
Figure 12A:
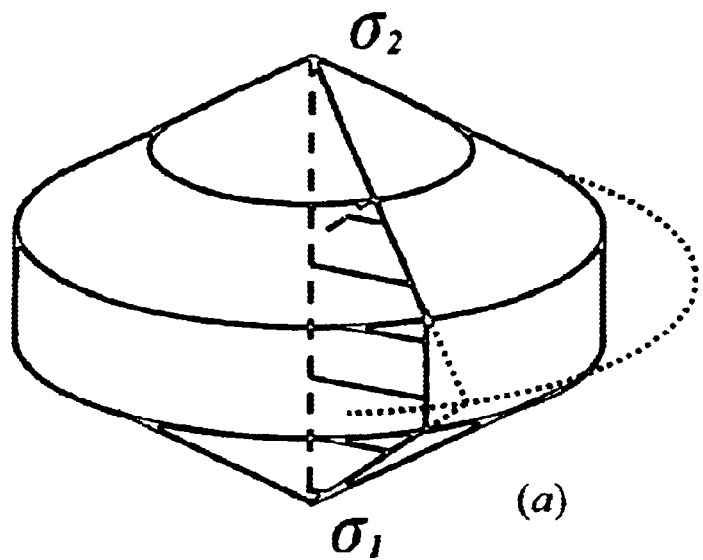
FIGS. 12a and 12b are schematic diagrams which show a point map for the end of the bar in FIG. 1, with a tolerance t on length, a tolerance t' on orientation, and a tolerance t" on flatness.
Figure 12B:
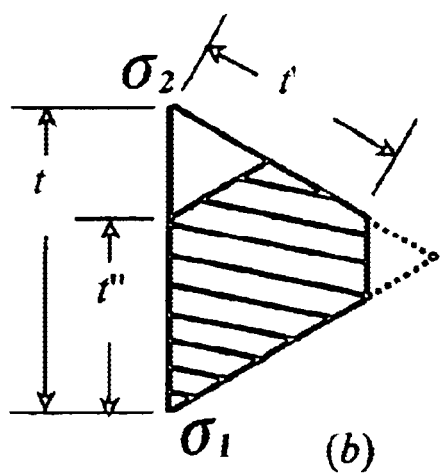

Consider the surface at the upper end of the round bar in FIG. 1 to be positioned with a length tolerance t, to be limited in orientation by a tolerance t', and to have a flatness tolerance t". Half the cross section of the point-map is shown in FIG. 12(*b*) that is obtained by combining FIGS. 4(*b*) and 5(*a*). The three dimensional map is shown in FIG. 12(*a*); it is obtained by truncating the volume in FIG. 3 with an outer cylinder. To apportion tolerances, it is reasonable to measure relative cost with ratios between volumes of the point-map. For example, as discussed above incremental volumes were related to orientational tolerance t' and form tolerance t". Although the optimal balance (ratio) between the two corresponding volumes would depend on the machinery in a given manufacturing plant, we can assume a theoretical ratio of unity. Therefore, the new tolerance-model, together with this theoretical assumption, suggests that, when tolerances t, and t" are assigned together, the added costs for manufacturing with these tolerances will be made equal when t and t" are chosen so that the volume swept by the hatched region in FIG. 5(c) is made equal to the volume from the dotted triangle in FIG. 4(b).

Figure 9:
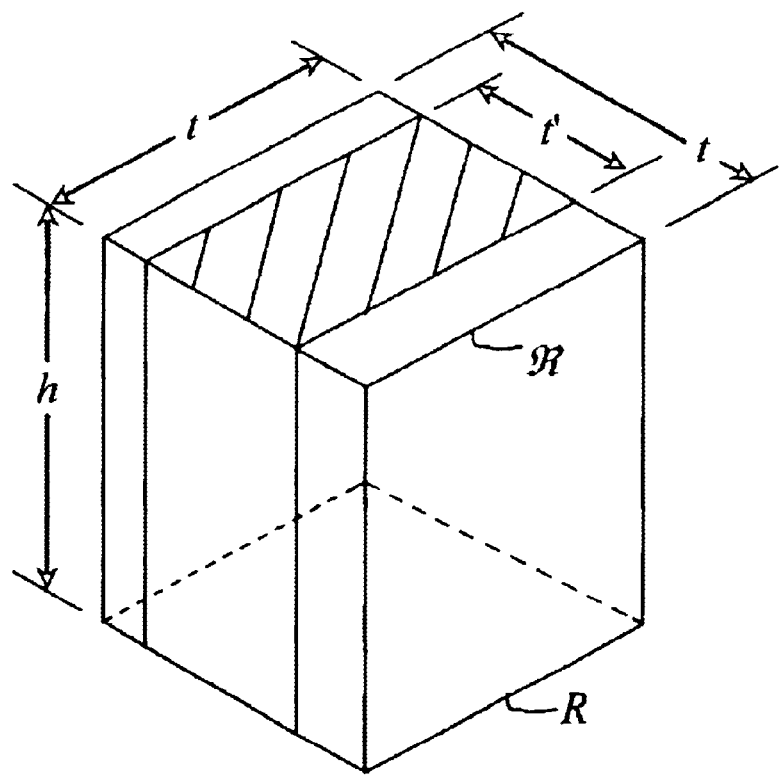
FIG. 9 is a schematic diagram which shows the tolerance zone for the axis of a hole, which is nominally vertical that is located with a tolerance t (bidirectional positional tolerancing) in a plate of thickness h. The tolerance zone t' for parallelism is shown in hatched in rectangle R.

For some arrangements of dimensioning, some types of tolerances, and some assemblies, the geometric maps in FIGS. 8 and 9, and the computations in equations (5) and (6) should be suitable for distributing tolerances among the types and distributing them among dimensions in a stackup. However, to apportion tolerances to cylindrical surfaces having size in a manner similar to that in the previous paragraph for planes, the geometric map in FIG. 11 seems awkward. But the coordinates of screws also lend themselves to treatment in higher space in which variations in size are represented equally with variations in location of the axis. Then tolerances on size, location, orientation, and form for a hole (or other round part) can be handled in a uniform way. This would permit the coupling (i) between size and form tolerances of a round object, and (ii) between size and location to behave much as the coupling between form and location of a plane surface.

The basic elements of a degree of freedom model was established in Kandikjan T., Shah J., HA Computational Model for Geometric Dimensions and Tolerances Consistent with Engineering Practices, 1998 ASME Design Tech. Conf., Atlanta, September, and in Yan, Y., Shah, J., "Representation and mapping of geometric dimensions from design to manufacturing", 1996ASME Computers in Engineering Conference, CD-ROM Proc., Aug., Irvine, Calif., which are incorporated herein by reference. Here, formal representations of these concepts are established to define algebraic operators to manipulate and combine control frames, to define tolerance classes with control frames, and to unify this model with the local model.

There are four basic concepts used in the formulation of the global model: rigid sets, control frames, entity degrees of freedom, and surface mapping. A rigid set is a group of entities fixed in position and orientation with respect to each other by geometric relations. Thus, a rigid set can be moved around as a unit with respect to the rest of the model. We define control frames {D, T, R} as directed geometric relations R between datum D and target T rigid sets. degrees of freedom of an entity or rigid sets are translations (x,y,z) or rotations ($\alpha$, $\beta$, $\gamma$) that are not constrained by geometric relations minus the invariant directions. An entity or rigid set is invariant in those transformations that have no effect on its location or orientation. If D,T are single entities, then we can enumerate a finite set of control frames (CF) based on different combinations of {D, T, R} that we will refer to as atomic control frames. Also, at the atomic level there are only two metric relations, distance and angle. There are three sub-types of each metric relation: namely, point-to-point; radial or spherical distance; and angle for a plane, cone, or helix. The degrees of freedom of all types of surfaces can be represented by combinations of points, lines, and planes. This establishes a mapping between surfaces and control frames. By considering combinations of atomic elements two at a time and the distance and angle measures we can enumerate several cases of primitive constraints.

The global model will be formulated as follows. Surfaces used as datum or targets in the dimensioning scheme will be mapped to equivalent control frames, as per the mapping table given above. Datum reference frames will be formed as rigid sets and validated using degree of freedom algebraic operations described below. Rigid sets will also be formed similarly for target features and feature patterns, such as a circular pattern of bolt holes. Dimensions and tolerances will be represented by the union of corresponding control frames involving the datum and target rigid sets and the appropriate tolerance class described below. degree of freedom algebra will again be used to identify redundant or conflicting controls described below. This method can be applied to single parts and assemblies in exactly the same way since we consider all entities to have kinematic degrees of freedom unless constrained. Once the global model is complete, any geometric control chain can be extracted for the purpose of stack-up analysis or determination of tolerance maps at any local level of interest.

Consider now the characterization of tolerance classes by control frames (control frame). The concepts presented in the previous two sections provide a mechanism for formal representation of each of the Y14.5 tolerance classes.

Size tolerances apply to linear dimensions involving what Y14.5 calls features of size: parallel planes, cylinders, and spheres. Representing their degree of freedom by the proposed control frames is straightforward.

Form tolerances require no datum; hence they are self referencing and can be represented by a degenerate control frame. No degrees of freedom are removed by the application of form tolerances.

Orientation tolerances will be modeled by control frames corresponding to the datum-target combinations. For example, if one hole is used as a datum for making another hole parallel to it, the control frame is: {L, L, {a, $\beta$}}. Since L has four degrees of freedom, this frame does not fully constrain the hole; its two translational degrees of freedom are still free and a position tolerance can still be added using another datum reference frames.

A location tolerance requires a datum reference frames with up to three data specified in a particular order. Then the datum reference frames can be constructed by progressive combination of datums one at a time with appropriate constraints. The tolerance control frame can be modeled as a union of the datum and target control frames.

Consider the validation of datum reference frames (DRF). We introduce the concept of control equivalence. Control frames built from two nonparallel planes, parallel line and plane, or two parallel lines and a plane are equivalent because they control the same number and type of degrees of freedom. Such equivalencies may be useful in evaluating manufacturability, allowing designers to change datum reference frames without sacrificing accuracy. Another capability of this model is the accounting for datum precedence, which may control different degrees of freedom because, even if maximum control is exercised in all cases, because each entity in the control frame has different degrees of freedom. Being able to determine which degrees of freedom of an entity or feature are controlled and by which datum gives us the means to identify conflicts.

The invention thus is a tool for assisting in making correct decisions about allocating geometric tolerances. It also provides an improved method to identify trade-offs and to optimize the allocation of tolerances. The result is a shorter design time, fewer iterations in the prototype phase of design, and hence lower cost.

Figure 13:
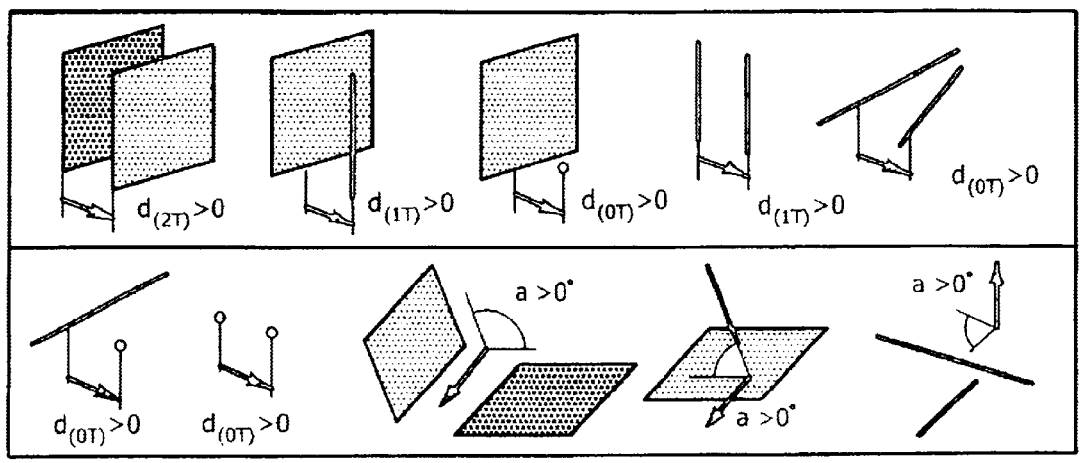
FIG. 13 is a block diagram of the software system architecture of the invention.

The software implementation of the invention is illustrated in the block diagram of FIG. 13. The modules required to implement the bi-level tolerance model and their relationships are shown in schematic form in FIG. 13. Modules M1 through M7 are not commercially available software packages, but can be written according to the teachings of the present invention. Also, implementation of the invention requires the use of three types of conventionally available software/function libraries: a geometry engine (E1), a constraint solver (E2), and a statistical tolerance analysis package (E3). There are many commercially available software packages in each of the above categories. For example, function E1 can be satisfied by ACIS, Parasolid, or DesignBase; function E2 can be 1% satisfied by DCM 2D./3D, DesignSheet, or Maple; function E3 can be satisfied Mechanical Advantage, VSA-3D. The functions typically available in each of these three types of software packages are described below.

Consider first the geometry engines E1 and their typical solids creation capabilities. Solid modeling kernels, such as ACIS and Parasolid, have various different capabilities of constructing a solid. The broad categories of solid constructions in such geometry engines are:

using solid primitives
enclosing a void
sweeping a surface
lofting, skinning a set of cross-sections
creating surfaces directly Creation of solid primitives such as cuboids, pyramids, cylinders and cones which are of interest in the creation of three dimensional tolerance maps involve a one step process of calling the respective API function. These API functions take in as parameters the corresponding parameters of the solid. For instance, in ACIS, a product of Spatial Technologies, Inc:

api_make_pyramid creates a pyramid by taking in the height, radii and number of sides. Similar APIs exist for the creation of cones, cylinders, blocks and several other primitives. Following is a list of some such APIs in ACIS:

api_make_cuboid Creates cuboid of given width, depth and height.

api_make_frustum Creates an elliptical cone or cylinder of given height and radii.

api_make_prism Creates an elliptical prism of given height, radii and no. of sides.

api_make_pyramid Creates an elliptic pyramid of given height radii, and no. of sides.

api_make sphere Creates a sphere of given radius.

api_make torus Creates a torus of given major and minor radii.

api_solid_block Creates a solid block given two diagonal positions.

api_solid_cylinder_cone Creates a solid cylinder or cone given two positions.

api_solid_sphere Creates a solid sphere given the center and radius.

api_solid_torus Creates a solid torus given the center and major and minor radii.

Similar functions can be found in PARASOLID:

PK_CONE_create Creation of a cone
PK_SPHERE_create Creation of a sphere
PK_PLANE_create Creation of a plane
PK_CYL_create Creation of a cylinder Consider the function of enclosing a void. If surfaces can be created individually, there are facilities to combine them into a volume. For example, the ACIS API api_enclose_void modifies an enclosing set of faces from void bounding to material bounding. This technique is especially useful in creation of tolerance maps when the required solid is irregular and it is convenient to simply create the surfaces and combine them into a volume. The API api_regularise_entity removes all faces, edges and vertices that are unnecessary to support the topology of the entity.

Sweeping functions in most solid modelers permit a variety of differing input arguments, such as:

a sweep distance
a position for sweep start and a sweep vector
a sweep vector
a sweep path that could be non-planar These operations find a use in creation of tolerance maps when the required maps are symmetric about an axis. In such a case, a two dimensional wireframe of the profile is all that needs to be created, which then can be swept about an axis to result in a solid. A very useful function in ACIS for sweeping operations is the overloaded API api_sweep_with_options. One of its parameters is an object of the sweep options class. The sweep options data structure is used to define how to sweep and what the results should be. They can be used to define drafting, twisting and profile orientation along a nonplanar path, etc. A detailed list of functions in ACIS that may be used in creation of tolerance maps follows:

api_rsw_face_path Does a rigid sweep of a face along a path.

api_rsw_face_vec Does a rigid sweep of a face along a vector.

api_rsw_wire_path Does a rigid sweep of a wire along a path.

api_rsw_wire_vec Does a rigid sweep of a wire along a directon . . .

api_sweep_with_options Sweeps a profile along a path using laws to control its behavior.

api_sw_chain_axis Sweeps an open or closed chain of coedges around an axis given by a point and direction.

api_sw_chain_path Does a sweep of a face or a wire along a path with twist.

api_sw_chain_path options Does a sweep of a face or a wire along a path with a rail.

api_sw_chain_surface Sweeps a chain of coedges along given path onto given surface to make a sheet.

api_sw_chain_vec Sweeps a (planar) chain along a given vector.

api_sw_chain_wire Sweeps an open or closed chain of coedges along a path given by a wire or a wire body.

api_sw_face_axis Sweeps a (planar) face around an axis by given angle.

api_sw_face_norm Sweeps a (planar) face along its normal by given distance.

api_sw_face_surface Sweeps a face in given direction on to given surface.

api_sw_face_vec Sweeps a (planar) face along given vector.

api_sw_face_wire Sweeps a face along a path given by a wire or a wire body.

api_sw_wire_axis_sol Sweeps a (planar) wire around an axis by given angle.

Equivalent functions in Parasolid are the sweep and the swing functions. The swing functions are used when a cross-section is to be revolved about an axis and the sweep operation is used when a cross-section is to be swept along a vector.

Also available in geometry engines is the ability to loft or skin surfaces. Skinning in ACIS fits a surface through a series of curves (wire bodies). Lofting in ACIS starts with a surface and fits another surface through a coedge of the original surface and a series of curves (coedges). Lofting takes into consideration the tangents from the original surface at the first coedge and last curve. The process of lofting consists of fitting a surface (void bounding or otherwise) given two curves (wire bodies). One of the surfaces may be degenerated to a line or a point. For instance, if a circle and a point which is at a certain distance from it, are lofted, a cone results. The API for this function is api_skin_wires that takes in a list of wires as its parameter.

Most of the available solid modelers support Boolean operations on solids. This may be put to use to combine existing solids. A potential application of this operation is in building accumulation maps that involve 'sweeping' of a body over others. The process would involve placing the body to be swept at various 'swept' positions on the body to be swept over and performing a Boolean add at each stage. The result would be the desired accumulation map. However, the accuracy of the resulting map would depend on the number of Booleans carried out; more the better. In order to reduce the resulting increase in the computational time and cost, a few Booleans are carried out that result in an approximate shape. A convex hull finding algorithm may then be applied to yield the resulting object, which would be the desired tolerance map. The Parasolid function PK_REGION_combine_bodies has the ability to join a body to a specified region in another body—a useful function for the creation of tolerance maps.

Figure 22:
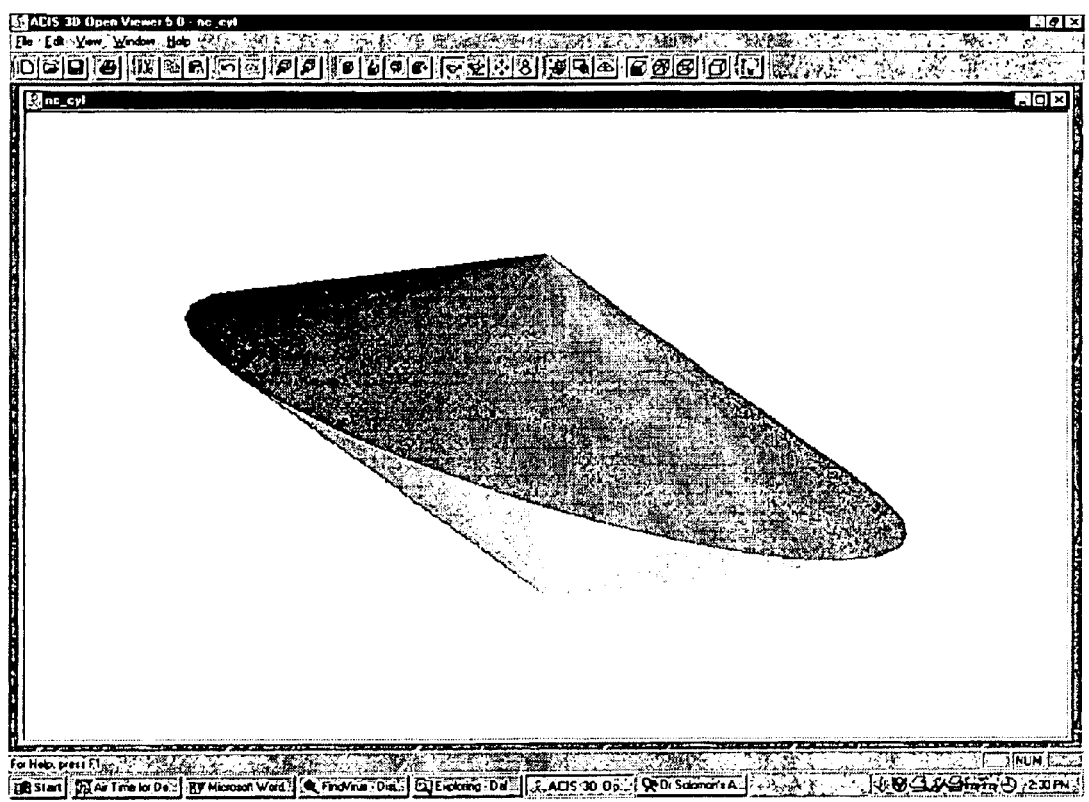
FIG. 22 is a depiction a non right circular cone created in ACIS using b-spline functions.

Various construction techniques for surfaces that employ properties of b-splines, may also be used. This technique is useful for creating objects such as a non-right circular cone (a tolerance map that results when two non-coaxial cylinders are under investigation). There are no trivial operations to construct such a cone. In PARASOLID, the equivalent function is PK_BSURF_create. FIG. 22 shows a non right circular cone created in ACIS using b-spline functions. In particular, the function bs3_surface_rule_from_point is like the lofting operation, but can handle bs3 curves in any orientation. The tolerance map shown in FIG. 22 was obtained by using an elliptical bs3 curve and lofting it using the mentioned b-spline function to a point.

Two additional functions are needed that were not found in ACIS or Parasolid:

Create Convex Hull for a Polyhedral part

Create Minkowski sum of two polyhedral parts

However, the algorithms for these are well known state of the art.

Consider now constraint solvers E2. There are basically two types of solvers available commercially. The distinction proceeds according to whether the system of geometric constraints is converted to one large system of non-linear equations or whether the geometric entities are acted on directly. If the set of geometric constraints is mapped to one large system of equations then these equations can be solved purely numerically or by symbolic mathematical processing. Numerical methods seem to be the fastest and easiest to implement but can have difficulty converging to the desired solution and do not generally allow determining which variables are under or over-constrained. Symbolic mathematical methods are slower but can save the solution steps for later calculations if variable values change. It is also possible to easily determine which variables are under or over-constrained. Symbolic mathematical methods can be divided into those which hold the equations in a list and those which hold the equations in a (bipartite) graph based on which variables occur in which equations. In the latter group a solution sequence may be inferred without even considering what exactly the equations are. Methods of the former group are found in the field of symbolic and algebraic computation. This field has spawned commercial products such as MAPLE, MATHEMATICA and AXIOM, which are able to symbolically manipulate and solve equations, including equations with derivatives and integration.

Methods that consider the incidence of variables in equations usually operate on bipartite graphs in which one set of nodes, representing variables, is connected by edges to another set of nodes, representing equations. These methods solve for one solution and tend to have difficulty with "strongly connected components" (cycles in the graph). For portions of the graph which are not strongly connected, two all encompassing rules apply:

i) each equation can be used to solve for only one unknown variable ii) each unknown variable can only be solved for by one equation and must be considered as a known in all other equations The net affect of this is that equations in a bipartite graph will only have one edge directed away, and all others directed toward them while variables in the bipartite graph will have only one edge directed toward them and all other edges directed away. Algorithmic Graph Theory provides several techniques for directing bipartite graphs efficiently. DesignSheet from Rockwell International is an example of such a product available commercially. Another graph based system that operates directly on geometric constraints is DCM from D-Cubed. It can handle both two dimensional and three dimensional constraint sets, as described below.

Consider the dimensional constraint manager (DCM, DCM 2D, DCM 3D are products of D-Cubed, Cambridge, UK). DCM is designed to provide functions to support the development of parametric CAD systems for geometric construction of mechanical parts using constraints. DCM 3D supports points, unbounded lines, circles, planes, spheres, cylinders, swept surfaces, parametric curves and parametric surfaces in three dimensions. The geometric entities managed by DCM may have dimensional constraints (distance, angle, and radius) and logical constraints (such as perpendicularity, parallelism, coincidence, etc.) between them. Also supported, are a number of additional constraints that can be used by an application to control which solution is returned in the case of multiple solutions. DCM supports the concept of rigid sets; a rigid set being a collection of geometric entities that are mutually constrained. Any transformation applied on the set with respect to some other set or geometry does not change the internal shape of the rigid set but only transforms the set as a whole.

Figure 23:
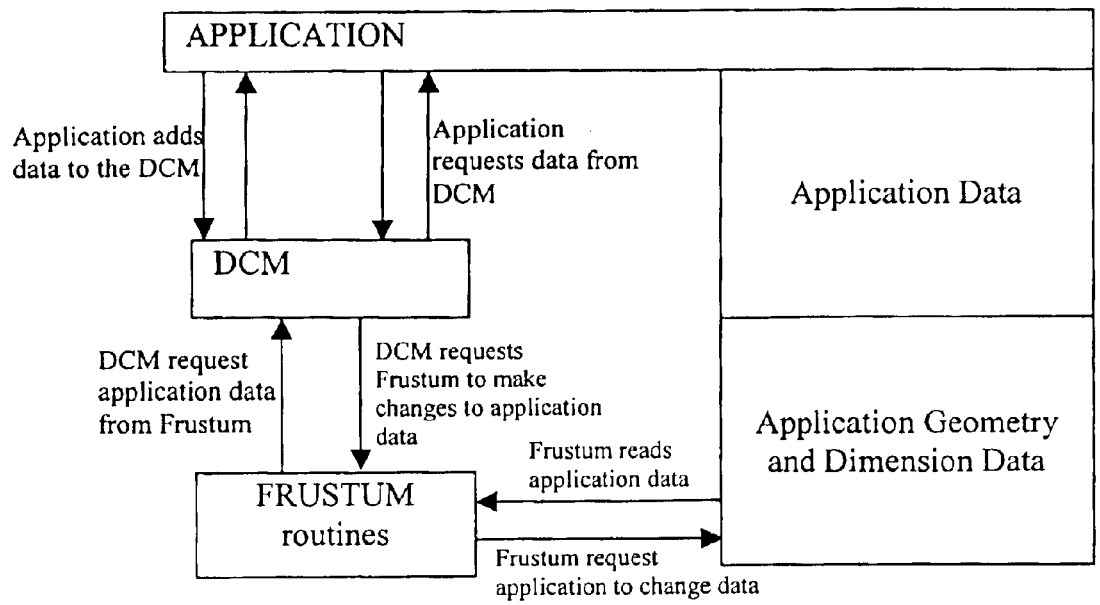
FIG. 23 shows the DCM software structure.

The geometric and dimension data of the application are accessed by the DCM via the Frustum interface. The functions in the frustum interface are supplied by the application, to provide information about geometric and dimension entities and to allow DCM to alter the geometry. FIG. 23 shows the DCM software structure. Integration of the DCM solver with an application typically involves the creation of a new dimension_system object, assigning the geometry nodes of the application to the geometry nodes of DCM (g_node) and assigning the dimension nodes of the application to the dimension nodes of DCM (d_node). Certain geometry nodes (or sets) need to be 'fixed' in order to serve as a reference. Functions may then be called to evaluate and modify the geometry, either incrementally, as the d_nodes and g_nodes are assigned, or at the end. The functions return a status code that informs the user of the statuses of geometries, dimensions, constraints, etc. after the evaluate function has been called. For instance, among the codes returned for geometries are fixed, over_defined, not_consistent, not_changed, well_defined, under_defined depending on the ability of the solver to obtain a solution and those for dimensions are over_defined, not_consistent, solved, not_changed. DCM provides functions that allow the application to perform a check before a dimension is added between entities to find whether the dimension will result in overconstraining.

Finally consider the statistical tolerance analysis packages E3. Commercial tolerance analysis software includes products marketed under the following names: VSA, VALYSYS, Mechanical Advantage, and Saltire. The analysis services available in these programs are:

1. Sensitivities
2. % Contributions
3. Worst case stack-up and acceptance rate
4. Statistical stack-up (linearized) and acceptance rate
5. Monte Carlo simulation (non-linear)

Figure 24:
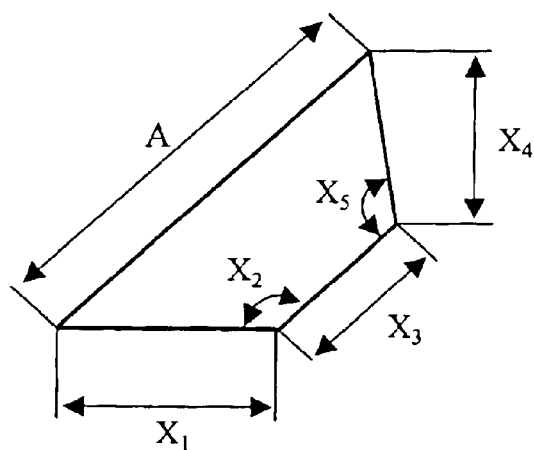
FIG. 24 is a diagram illustrating the operation of the statistical package.

The following is a brief description of how these functions are typically carried out. Suppose that in FIG. 24, A=dimension of interest and Xi are contributing dimensions. Therefore, A is related to Xi by a set of functions $f$.

$$A = f(X1, X2 \ldots Xn)$$

$f$ is called the "design function" in commercial packages. It is usually non-linear. We claim that the design function used in conventional commercial system does not account for types of geometric tolerances, such as form. This is where our model comes in. The algebraic form of our local model will replace the design function used in such systems, but the rest of the analysis will proceed conventionally.

The steps used in commercial statistical packages are as follows:

Linearize $f$ $$dA = \frac{\partial f}{\partial X_1} dX_1 + \frac{\partial f}{\partial X_2} dX_2 + \ldots \frac{\partial f}{\partial X_n} dX_n + \text{higher terms.}$$

Define $$f_i = \frac{\partial f}{\partial X_i}$$

(called sensitivity of A to Xi)

Sensitivities are independent of tolerance.

Assume Normal distribution for all Xi. Assume that the tolerance band for each ΔXi is $6\sigma_1$, as shown in FIG. 25, that is $$\sigma i = \frac{Ui - Li}{6}$$

Figure 25:
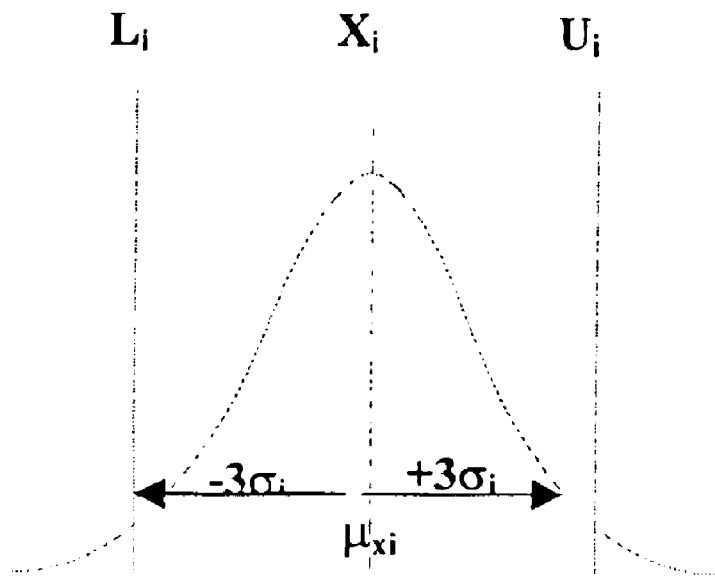
FIG. 25 is a diagram illustrating a normal distribution in a tolerance band.

Assume $$\mu_{xi} = \frac{Ui + Li}{2}$$

Where Ui and Li are the upper and lower limits of the dimension as shown in FIG. 25.

Stack-Up Calculation $\mu_A = f_1 \mu_1 + f_2 \mu_2 + \ldots f_n \mu_n\}$ gives mean for A $\sigma_A^2 = f_1^2 \sigma_1^2 + f_2^2 \sigma_2^2 + \ldots f_n^2 \sigma_n^2\}$ gives variance for A % contribution of $$X_i = \frac{f_i^2 \sigma_i^2}{\sigma_A^2} \times 100$$

Acceptance Rate for A

Figure 26:
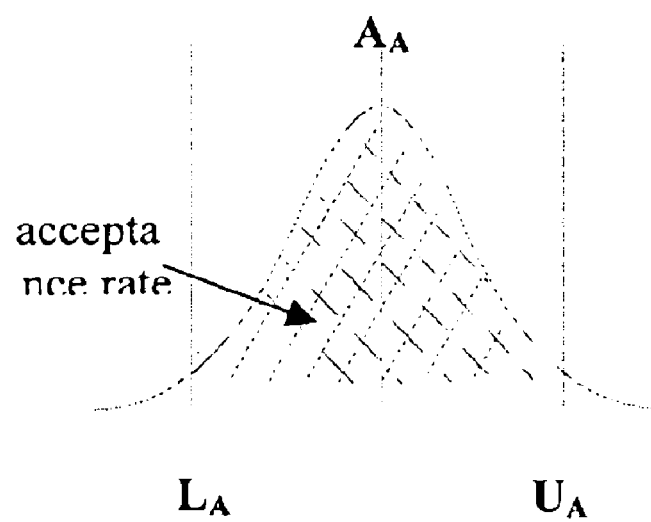
FIG. 26 is a diagram illustrating the statistical acceptance rate.

Since $\mu_A$ and $\sigma_A$ are known we can construct the distribution for A. Suppose the designer has specified $U_A$, $L_A$ as the limits for A, then we can calculate the statistical acceptance rate from the shaded area shown in FIG. 26 that can be found from standard distribution charts.

Following is a brief description of the software modules needed to implement a comprehensive dimension and tolerance specification, validation, allocation, and analysis system to support an engineer in the design of precision mechanical parts and assemblies.

Consider first the module M1 for geometry definition of the system. Although there are many commercially available software systems (commonly known as parametric CAD systems) that allow one to specify and visualize the geometry of mechanical parts and assemblies, such systems do not make available certain types of data to the users. Therefore it is necessary to create a geometry definition system fall the purpose of implementing the bi-level tolerance model presented in this application. The procedure for creating such a system from commercially available geometry engine's (E1) and constraint solvers (E2) described above is well known and state-of-the-art.

In M1 a boundary representation (B-rep) solid model system is built by using a geometry engine (E1) or of the solid model created elsewhere may be imported in a standard format in the form of data files. Various constraints (distance, angle, etc.) may be added to the model and sent to the constraint solver (E2) to seek a solution. The geometry engine (such as ACIS, Parasolid, etc.) is used for various geometrical and topological reasonings that may be involved during the design process. Module M1 also has a graphical user interface that allows the user to pick entities (faces, edges and resolved entities of features of size), specify required tolerance data and outputs error messages.

The M2 module, the dimensioning module is employed to specify a dimensioning scheme on the already constructed BRep solid model. The user need not specify the values of dimensions; only the dimensioning scheme needs to be specified. The values of dimensions are extracted from the solid model. Also extracted from the model are implied relationships between entities such as perpendicularity, coincidence, etc. This information is used to begin construction of the global model consisting initially of only a dimension graph that is incrementally constructed as the user specifies the dimensioning scheme. The dimension graph is composed of nodes and arcs—the nodes are entities that contain pointers to entities in the BRep and the arcs are dimensions (distance, angle, etc.). The arcs have pointers to the two entities that share the particular dimension. In some cases, such as a diameter dimension, the arc has a pointer to just one entity. The data structure of the nodes and the arcs are as follows:

```
Class NODE
Member Variables:

name:        CHAR       // entity name
type:        CHAR       // entity type (plane, axis, line, vertex,
    etc.)
DOF:         CHAR       // degrees of freedom of entity
pointer: ENTITY    // pointer to entity in B_Rep
next:        NODE       // pointer to next node
Class ARC
Member Variables:

type:        CHAR       // type of dimension relation (distance,
    angle, radius, etc.)
dim_type:    CHAR       // whether dimension is implied or
    user specified
left:        NODE       // node of DT graph (entity 1)
right:       NODE       // node of DT graph (entity 2)
dim_value:   DOUBLE     // dimension value
pos_tol_value:   DOUBLE    // positive size tolerance value
neg_tol_value:   DOUBLE    // negative size tolerance value
next:                    ARC        // pointer to next arc
```

Through the dimensioning process, checks are carried out for completion of dimensioning and redundant dimensions. This is done by the use of the constraint solver. Before the entities and the dimension constraints are sent to the solver for check of constraining, a datum reference frame, formed by the specification of target and datum entities, is built.

The corresponding control frame entities are also built and these entities are 'fixed' in the constraint solver and the constraining of other entities is determined with respect to these. As entities get mutually constrained, they fall into the same 'cluster'. The dimensioning is complete when all entities in the D&T graph are in the same cluster. Details of this procedure are given in (Kandikjian & Shah, ASME 1998) which is included here by reference. Another feature of this module is the extraction of distance and angle constraints from constraint graph. The designer may choose to either retain or discard these constraints in the dimensioning scheme, thus making the dimensioning constraints independent of geometry construction constraints.

Turn now to the module, M3, Global Model Visualization Module. The function of this module is to help the designer graphically visualize the global model in the form of a graph as it is incrementally constructed. The graph display also indicates which cluster an entity belongs to at any stage of dimensioning. The display shows the entities as square markers and the relationship between the entities as lines between them. The information for drawing this graph comes from the global model containing the entities and constraints. Coloring and the line type of the lines indicate the type of constraint that exists between the entities—thick black lines indicate a user specified dimension (distance or angle), red dotted indicate implied perpendicularity, etc. The entities may be moved around for better visualization. Cluster numbers and entity names appear as the cursor is moved over the markers. The display dynamically updates as the dimensioning and tolerancing scheme evolves.

In the module M4, tolerancing module, the module allows the designer to interactively specify dimensional and geometric tolerances on the mechanical part or assembly been designed. Corresponding to each type of tolerance specified by the user, tolerance data structures are created and attached as attributes to the entities in the dimension graph to complete the global model. Since multiple tolerances may be specified for an entity, multiple tolerance attributes may be attached to any of the model entities. Various checks, consistent with the ASME Y14.5 D&T Standard, are performed before instantiating the tolerance attribute. If a tolerance creation fails, the user receives error messages describing the cause of failure. Among the checks performed are: the refinement check that validates tolerance values according to a tolerance hierarchy, target and datum types which are checked during the graphical picking of entities, number and type of datum(s) and material condition modifiers. The clusters concept and the use of a constraint solver for validation of constraints also applies here to tolerance classes such as position, which may have up to 3 datums specified. Each tolerance class is derived from a general tolerance class. Data structures of the tolerance superclass and orientation subclass are given below as examples:

```
Class GEN_TOL
Member Variables:

tol_name:    CHAR      // tolerance name (size, parallelism, etc.)
tol_value:   DOUBLE    // tolerance value
entity_name: CHAR // name of entity to be toleranced
entity_type: CHAR // type of entity toleranced (plane, axis, etc.)
Class ORIEN_TOL (derived from GEN_TOL)
Member Variables:

mat_cond_tgt:   CHAR // material condition of tol. entity
mat_cond_dat:   CHAR      // material condition of datum
datum_name:     CHAR           // name of the datum
```

The use of module M5, the GD&T schema advisor is optional. Apart from the primary goals of the global model of linking all local models and integrating tolerance modeling with geometric modeling, it can also be used for supporting validation of the dimensioning and tolerance scheme chosen by a designer. This is done by collecting certain good practice rules for geometrical tolerancing and storing these rules in a knowledge-base. The advisor detects the cases where the rules apply during a tolerance specification and checks whether a better practice, in terms of ease of manufacture or inspection, exists. The advisor warns the user of bad elements and suggests alternatives. The implementation of this module is not essential.

Consider module M6, the tolerance allocation module. During the tolerance specification stage, the designer's tolerance specifications are only tentative. He needs to understand the consequences of his decisions and tradeoffs involved. The objective of the tolerance allocation module (M6) is to re-allocate tolerances between intermediate involved in a stack up, or between different tolerance types (size, form, orientation, etc.) applied to the same feature. This is done by the creation of local models, which take two alternative forms: algebraic and geometric. The algebraic form provides the equations needed by statistical tolerance analysis packages (E3) to analyze sensitivities, percent contribution, acceptance rates, etc. The geometric form comprises two kinds of Tolerance Maps (a hypothetical volume of points that describe the positions of a surface)— functional and accumulation. The input to the program consists of all types of tolerances required of the functional surface, their values and the datums (if applicable). This input comes from the global model constructed earlier. The user identifies the functional surface and the intermediate surfaces may either be identified automatically or manually. Using these data, the program builds a 3-D model (or the 3-D functional tolerance map) based on the mathematical formulation of local models described earlier. Also, using the aforementioned information, and the maximum possible tolerances of the intermediate entities (also computed by the program), the accumulation map is built ensuring that the functional map entirely contains the accumulation map. Their volumes are also calculated using the mass properties function available in any solid modeler, so that the user may select tolerances that yield the least difference in these volumes. This implies that the accumulation map must occupy as much volume as possible, since this governs the manufacturing costs (more the volume, more the number of permissible locations of the functional surface and hence lesser manufacturing costs).

Turn now to the module M7, the local model (tolerance map) visualization module. The geometric form of the local model is a three dimensional shape (tolerance map) whose size (volume) is indicative of the amount of variation allowable. The objective of this modules is to give visual feedback to a designer about the interplay of different tolerances by displaying the individual, accumulation, and functional maps superpositioned appropriately. We claim that there is no such mechanism available or possible with any of the other tolerance models.

Figure 14:
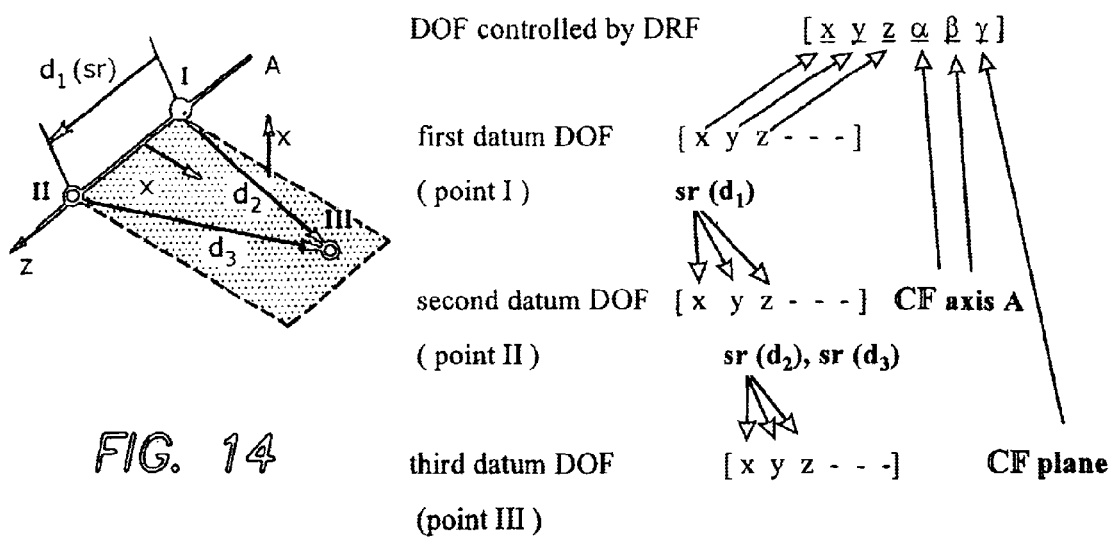
FIG. 14 is a diagram illustrating the operation of the geometry definition module (M1).

Finally, an example of the use of the system will be illustrative. Turn to FIG. 14 which is a depiction of a computer display which shows the creation of the solid model, including constraint specification and constraint solving as implemented by module M1, geometry definition. Constraints may also be specified on models that are imported from other files. The figure shows the geometry definition user interface.

Figure 15A:
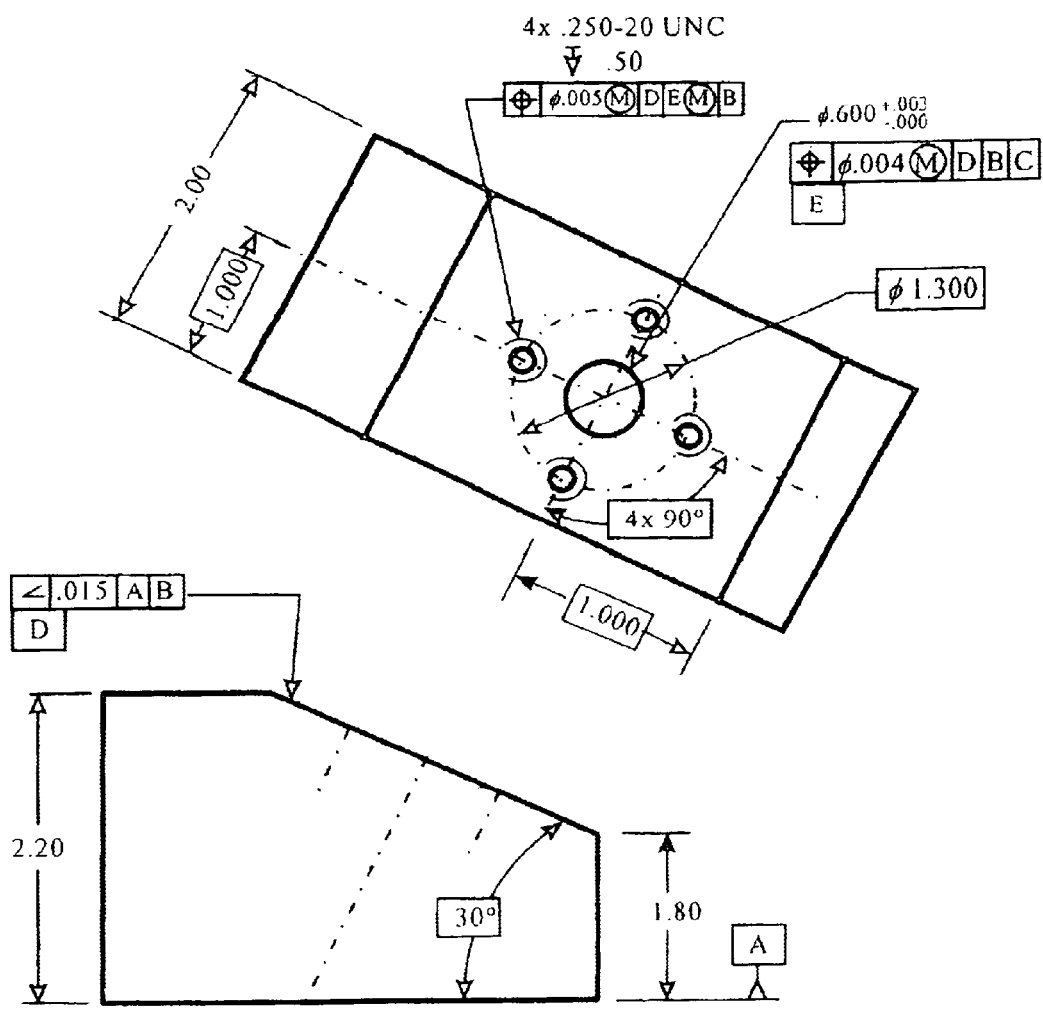
FIG. 15 is a diagram illustrating the operation of the dimensioning scheme M2 and skeletal global model construction module M3.
Figure 15A:
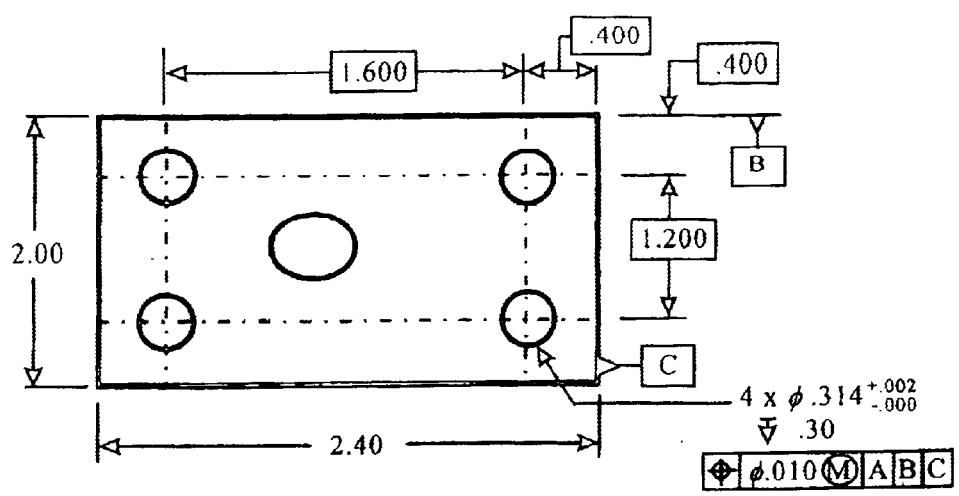
Figure 15B:
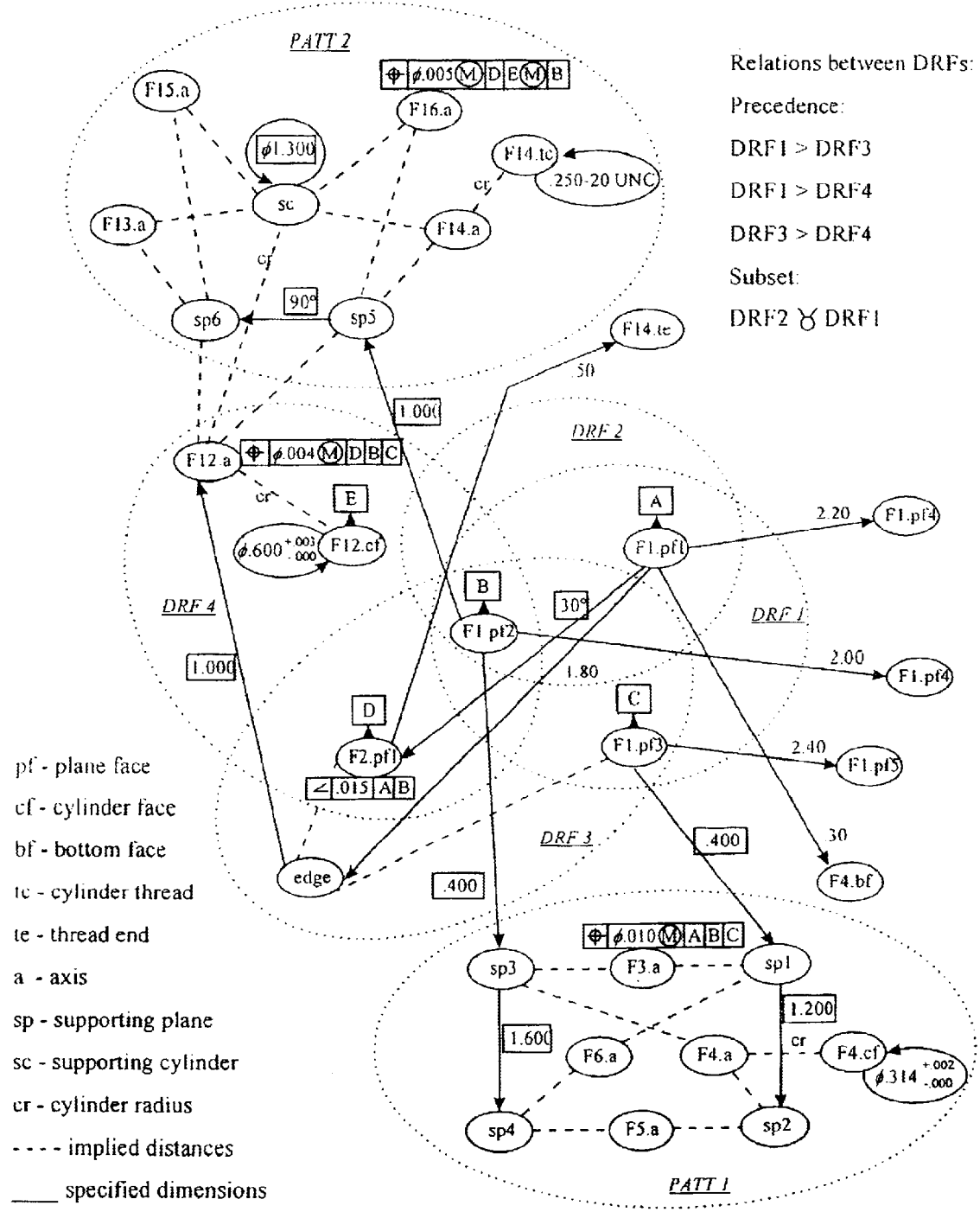

FIG. 15 is a depiction of the computer display of the next phase of operation as implemented by modules M2, dimensioning scheme, and M3, skeletal global modal construction, which starts with the construction of the model already complete. The process of dimensioning starts by the building of the skeletal global model, the dimension graph. The graph shown in the subscreen to the right only contains implied constraints like perpendicularity. No user specified dimensions exist at this point. In the graph, the square markers are the entities and the lines between them are the implied constraints.

Figure 16:
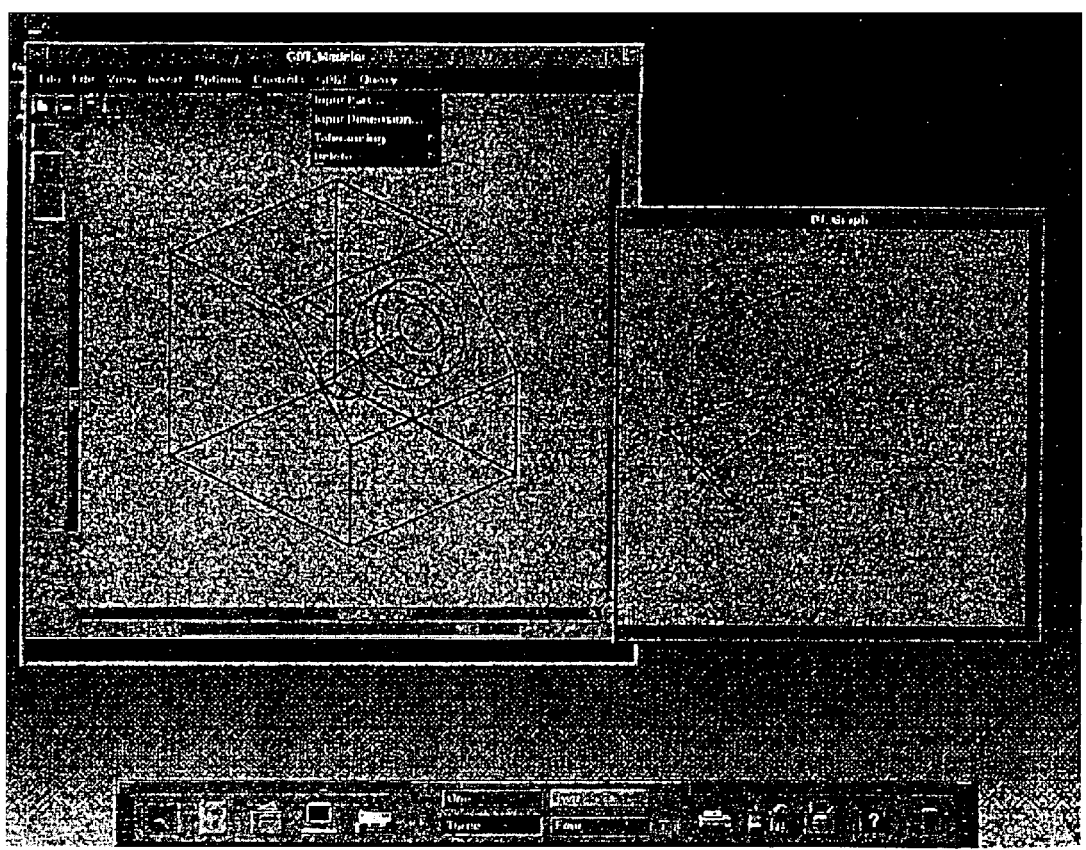
FIG. 16 is a diagram illustrating the operation of the incremental DT graph construction.

The next phase involves dimensioning with an incremental graph construction as shown in FIG. 16. This stage involves the specification of dimensions by the user. The thick lines between the entities in the graph in the right insert of FIG. 16 indicate such dimensions (there are 6 in the figure). These dimensions include distances, angles, diameters of cylinders, etc. The group or cluster to which an entity belongs is indicated when the cursor is moved over the entity. Dimensioning is complete when all entities are in group 1.

Figure 17:
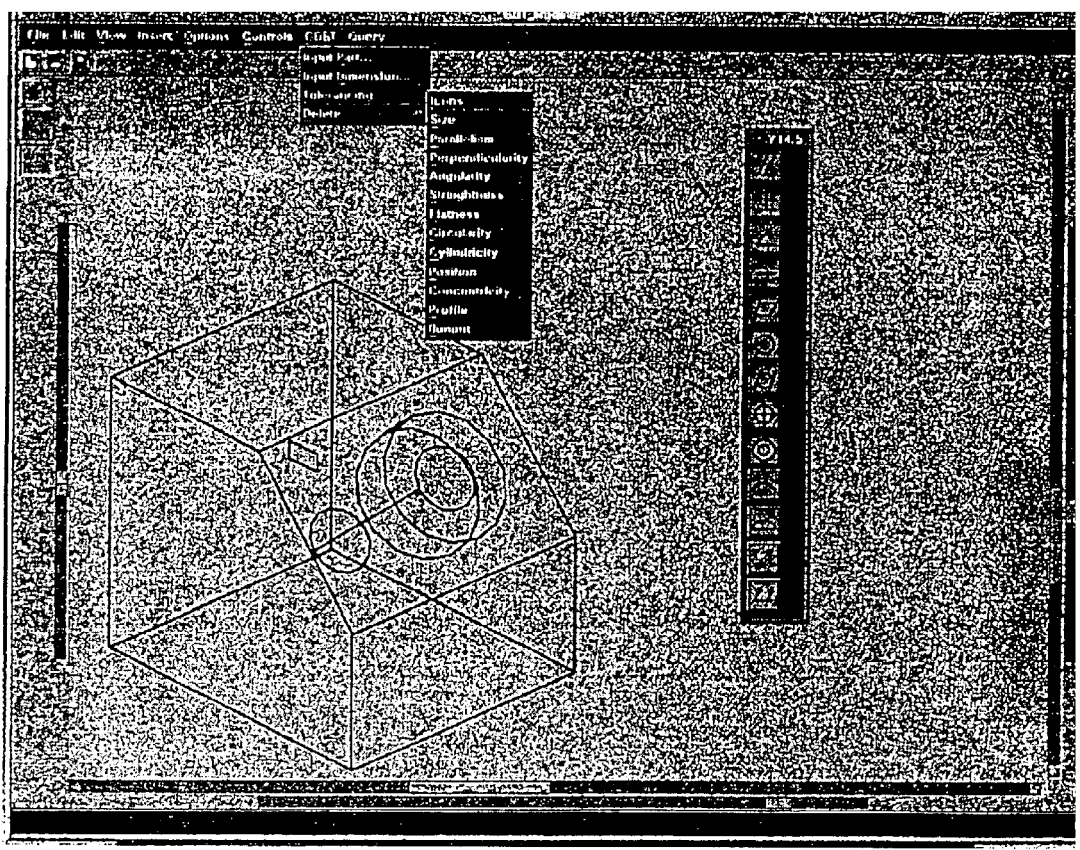
FIG. 17 is a diagram illustrating the operation of the tolerance specification module M4.

The operation of module M4, tolerance specification, is shown in FIG. 17. Once the part is completely dimensioned, the designer specifies a tentative set of tolerances. Size tolerances are specified by default when the user specifies dimensions between entities. This stage only involves specification of geometric tolerances. Relevant checks are carried out before a tolerance attribute is attached to an entity. The icons in the figure show all the types of tolerances supported by the system.

Figure 18:
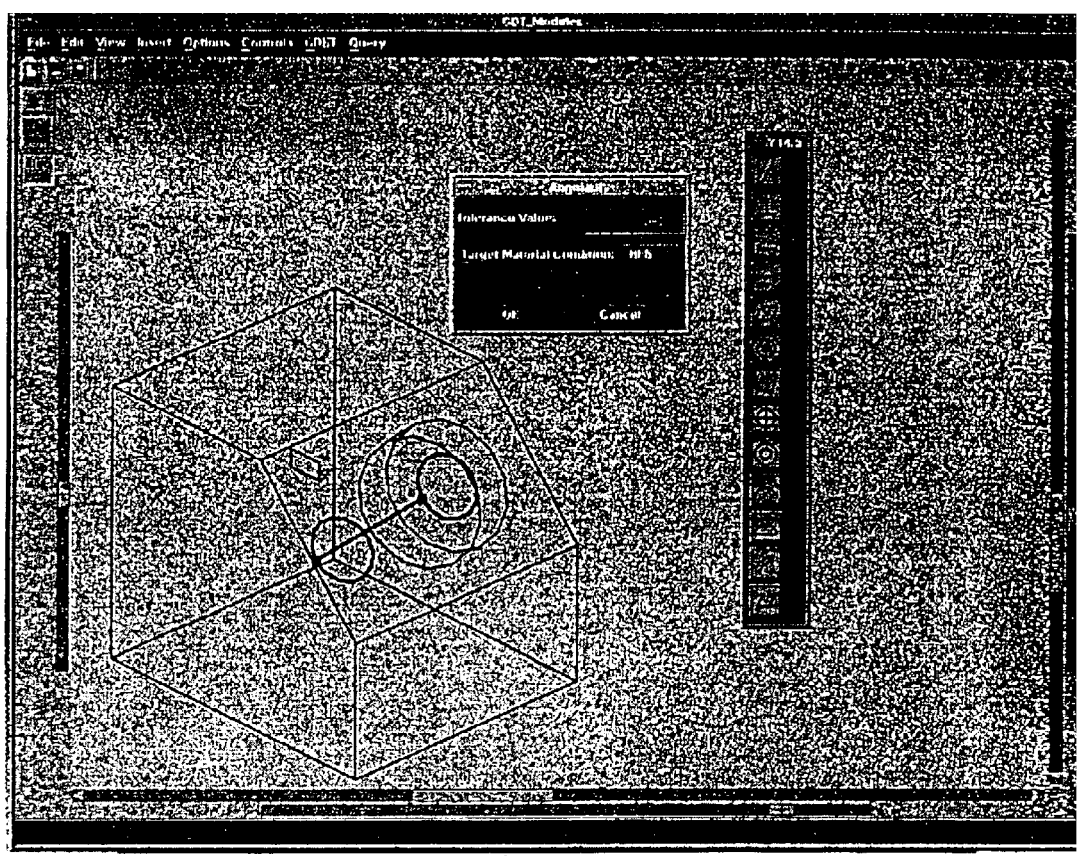
FIG. 18 is a diagram illustrating the operation of the GD&T Advisor module M5.

The operation of module M5, GD&T Advisor, is illustrated in FIG. 18. The figure shows the specification of an angularity tolerance for a feature of size (note that the hole axis is selected, a datum has already been selected and a material condition modifier appears in the dialog box).

Figure 19:
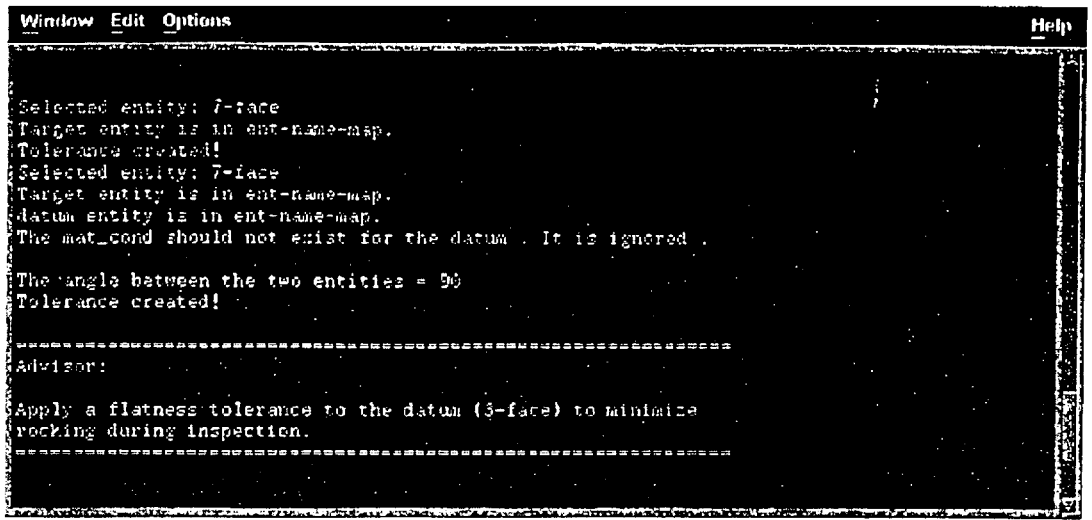
FIG. 19 is a screen listing illustrating the operation of the GD&T Advisor module M5.
Figure 20:
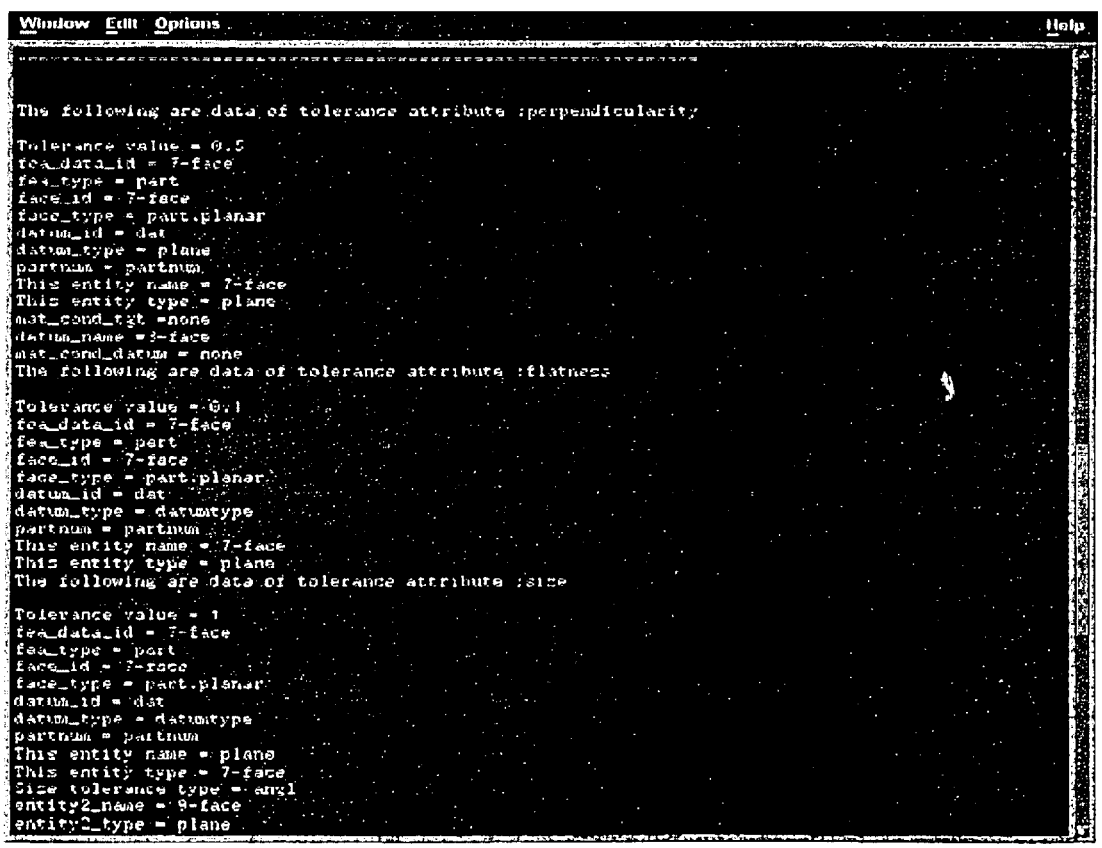
FIG. 20 is a diagram illustrating the attributes attached to an entity.

FIG. 19 shows a snapshot of the command window after the tolerance has been created. The GD&T advisor has found a situation matching one of the rules and suggests that an appropriate flatness tolerance be applied to the selected datum.

Figure 21:
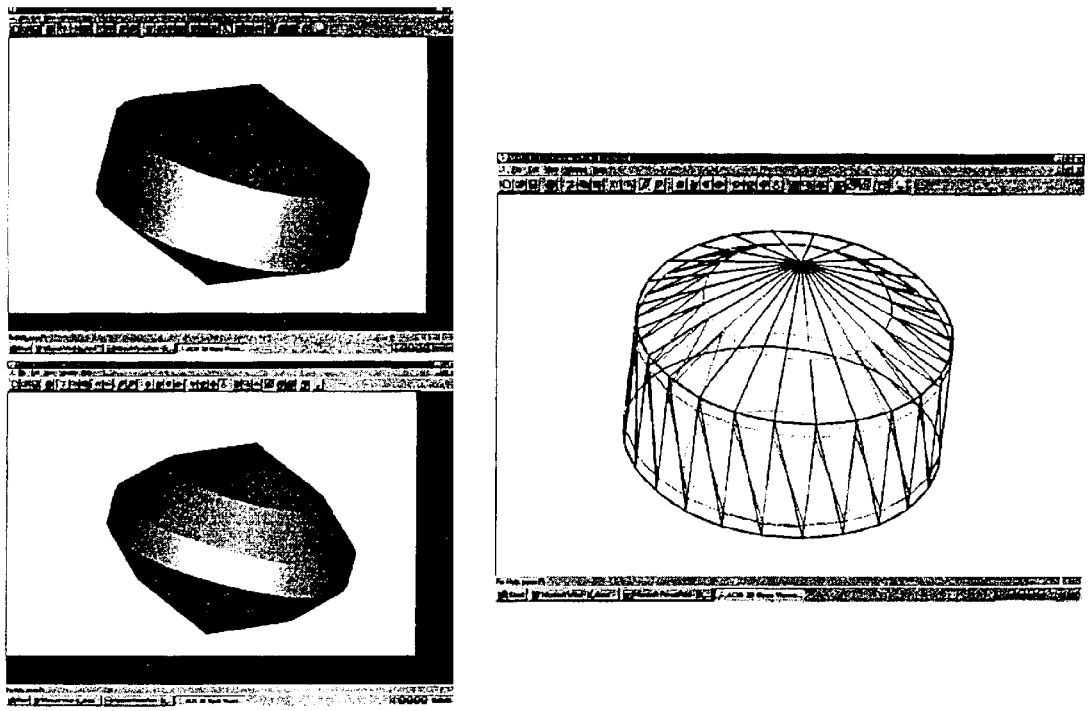
FIGS. 21a–c are graphic depictions illustrating the operation of the tolerance allocation module M6 and the tolerance map visualization module M7.

FIGS. 21a–c illustrate the operation of modules M6, tolerance allocation, and M7, tolerance map visualization. These figures show the functional map, the accumulation map and the overlapping of the two of the top face of the boss in the part shown in the previous few pages. The functional map results from specifying size and orientation tolerances to the face. All the information needed to construct these maps are obtained from the global model. The accumulation map is the result of stack ups that affect this circular face. The aim of the designer would be to allocate tolerances to intermediate faces (hence, further populate or modify tolerance attributes in the global model) and thereby manipulate the accumulation map such that (1) it fits within the functional map and (2) manufacturing costs are minimized.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A method of evaluating tolerances of computer assisted designs for the manufacture of objects comprising, for each object:

representing each tolerance zone for each geometric feature of said object by a model with an algebraic form and a geometric form, wherein the geometric form is represented as a tolerance map stored in a computer, each tolerance map comprising a hypothetical space of points that describes the acceptable positions of a surface of the object, wherein the tolerance map is a mapping of physical space into the hypothetical space of points such that the shape and size of the hypothetical space of points are functions of the tolerance zone;

computing in said computer interdependencies between said stored maps and interdependencies between submaps of said stored maps to determine how different tolerance zones for said geometric feature affect each other and to determine how different tolerance zones for different geometric features of said object affect each other, wherein a tolerance zone includes subzones and submaps correspond to subzones of tolerance zones;

determining how different tolerance zones for geometric features on different objects affect each other; and selecting tolerance conditions for said object to optimize allocation of tolerances to each of said geometric features of said object or objects.

2. The method of claim 1 where representing each tolerance zone for each geometric feature of said object comprises creating a tolerance map in three dimensions representing a plane.

3. The method of claim 1 where representing each tolerance zone for each geometric feature of said object further comprises creating a tolerance map in four dimensions representing a line, axis or edge.

4. The method of claim 1 where representing each tolerance zone for each geometric feature of said object further comprises creating a tolerance map in five dimensions representing the tolerances for each cylindrical surface, including tolerance on size and the tolerance-zone for the position of the axis of the cylindrical surface.

5. The method of claim 1 where representing each tolerance zone for each geometric feature of said object comprises creating a tolerance map representing a position.

6. The method of claim 1 where representing each tolerance zone for each geometric feature of said object or objects, comprises a tolerance map representing composite tolerances constructed as a Minkowski sum.

7. The method of claim 1 where representing each tolerance zone for each geometric feature of said object comprises a tolerance map in a space of points of variational possibilities of features of said object, and the tolerance map represents a population of imperfections in the object.

8. The method of claim 1 where representing each tolerance zone for each geometric feature, or combination of geometric features, of said object comprises creating a tolerance map in a space of points that represent the variational possibilities of manufacture for the features of said object.

9. The method of claim 1 where representing each tolerance zone for each geometric feature, or cluster of geometric features, of said object comprises creating a tolerance map in a space of points that represent the variational possibilities of manufacture for the features of said object expressed in areal (barycentric) coordinates.

10. The method of claim 1 where computing in said computer interdependencies between said stored maps and interdependencies between submaps of said stored maps comprises superimposing on a tolerance zone of said geometric feature an orientation tolerance zone which more stringently controls the orientational variations including parallelism, angularity and perpendicularity, from the nominal condition of said geometric feature.

11. The method of claim 1 where computing in said computer interdependencies between said stored maps and interdependencies between submaps of said stored maps comprises superimposing on a tolerance zone of said geometric feature a tolerance zone specifying form including flatness, straightness and cylindricity of said geometric feature.

12. The method of claim 1 where computing in said computer interdependencies between said stored maps and interdependencies between submaps of said stored maps comprises generating a tolerance zone of an assembled geometric feature for a assembly of at least two objects, each of which objects has a corresponding tolerance zone for corresponding geometric features which are being assembled to comprise said assembled geometric feature.

13. The method of claim 1 further comprising establishing a global model by mapping surfaces used as datum or targets in a dimensioning scheme to equivalent control frames in which datum reference frames are rigid sets and validated using degree of freedom algebraic operations, and by representing dimensions and tolerances by the union of corresponding control frames involving the datum and target rigid sets and corresponding tolerance classes.

14. The method of claim 13 wherein mapping surfaces used as datum or targets in a dimensioning scheme to equivalent control frames comprises forming datum reference frames as rigid sets for target features and feature patterns.

15. The method of claim 14 wherein mapping surfaces used as datum or targets in a dimensioning scheme to equivalent control frames in which datum reference frames are formed as rigid sets for a circular pattern of bolt holes.

16. The method of claim 13 further comprising identifying redundant or conflicting restraints by using a degree of freedom algebra on control frames by determining whether the corresponding datum reference frame is a rigid set and the maximum degrees of freedom which said datum reference frame controls.

17. The method of claim 1 where representing each tolerance for each geometric feature further includes representing tolerances for each tab or slot feature by generating a tolerance map in four dimensions that represents each feature, including the tolerance on feature size and the tolerance-zone for feature mid-plane.

18. The method of claim 1 further including representing a symmetry tolerance zone for features including a tab, slot, or cylinder, having two tolerances on size and the symmetry for relative position of feature mid-planes and/or axes, by creating a tolerance map in five dimensions to represent the symmetry of the tab or slot feature, or in six dimensions to represent the symmetry of the cylinder feature.

19. The method of claim 1 where further including representing the tolerances for a cluster of features including a point and a line, or a plane and a line, by creating a tolerance map of a dimension higher than the dimensions of a tolerance map for either feature individually, but lower than the sum of the individual dimensions of a tolerance map for either feature.

20. The method of claim 1 where representing each tolerance zone for each geometric feature of said object comprises creating combinations of said maps to represent the interaction between tolerances applied to each geometric feature.

21. The method of claim 1 where representing each tolerance zone for each geometric feature of each object comprises creating combinations of said maps to represent the accumulation of tolerances in the geometric features of the objects in stack-up analysis.

22. The method of claim 13 further comprising validating if the proper degrees of freedom of a feature are controlled by a datum reference frame, by using the global model to analyze the degrees of freedom controlled progressively to determine which degrees of freedom are controlled collectively by all datums in the datum reference frame and to determine which individual datum controls each degree of freedom to analyze the effect of datum precedence.

23. The method of claim 13 further comprising using the global model for tolerance refinement by controlling the same degree of freedom by more than one degree of freedom for selective finer controls on certain degrees of freedom.

* * * * *